(12) United States Patent
Arai et al.

(10) Patent No.: US 11,074,944 B2
(45) Date of Patent: Jul. 27, 2021

(54) SEMICONDUCTOR MEMORY DEVICE

(71) Applicant: TOSHIBA MEMORY CORPORATION, Tokyo (JP)

(72) Inventors: Fumitaka Arai, Yokkaichi Mie (JP); Keiji Hosotani, Yokkaichi Mie (JP); Nobuyuki Momo, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/502,852

(22) Filed: Jul. 3, 2019

(65) Prior Publication Data

US 2020/0135242 A1 Apr. 30, 2020

(30) Foreign Application Priority Data

Oct. 31, 2018 (JP) .............................. JP2018-205642

(51) Int. Cl.
G11C 5/06 (2006.01)
G11C 16/08 (2006.01)
(Continued)

(52) U.S. Cl.
CPC .............. *G11C 5/063* (2013.01); *G11C 16/08* (2013.01); *G11C 16/10* (2013.01); *G11C 16/24* (2013.01);
(Continued)

(58) Field of Classification Search
CPC .. G11C 5/063; G11C 6/08; G11C 1/24; G11C 16/10; G11C 16/30; G11C 16/26; G11C 13/002; G11C 8/14; G11C 7/18; H01L 27/11524; H01L 27/11519; H01L 27/10802; H01L 27/10897; H01L 27/1225; H01L 29/78648; H01L 29/7869; H01L 29/78696; H01L 27/124; H01L 27/248;
(Continued)

(56) References Cited

U.S. PATENT DOCUMENTS 7,382,018 B2   6/2008 Kim et al.
8,772,771 B2   7/2014 Tanaka
(Continued)

FOREIGN PATENT DOCUMENTS

JP   2008-078404 A   4/2008
JP   5604291 B2   10/2014
(Continued)

*Primary Examiner* — Mouloucoulaye Inoussa
(74) *Attorney, Agent, or Firm* — Foley & Lardner LLP

(57) ABSTRACT

According to one embodiment, a semiconductor memory device includes: first to fifth interconnects; a semiconductor layer having one end located between the fourth interconnect and the fifth interconnect and other end connected to the first interconnect; a memory cell; a conductive layer having one end connected to the second interconnect and other end connected to the semiconductor layer; a first insulating layer provided to extend between the third and fourth interconnects and the semiconductor layer, and between the fifth interconnect and the conductive layer; an oxide semiconductor layer provided to extend between the fourth and fifth interconnects and the first insulating layer; and a second insulating layer provided to extend between the fourth and fifth interconnects and the oxide semiconductor layer.

13 Claims, 26 Drawing Sheets

(51) Int. Cl.
  *G11C 16/24* (2006.01)
  *H01L 27/11524* (2017.01)
  *G11C 16/10* (2006.01)
  *G11C 16/30* (2006.01)
  *H01L 27/11519* (2017.01)
  *G11C 16/26* (2006.01)

(52) U.S. Cl.
  CPC .............. *G11C 16/26* (2013.01); *G11C 16/30* (2013.01); *H01L 27/11519* (2013.01); *H01L 27/11524* (2013.01)

(58) Field of Classification Search
  CPC ............ H01L 27/2436; H01L 45/1246; H01L 29/786; H01L 27/2418; H01L 45/1233; H01L 45/1253; H01L 45/145; H01L 45/1683; H01L 23/535; H01L 23/53266; H01L 27/11582; H01L 27/1157; H01L 27/1152; H01L 23/528; H01L 23/53295; H01L 21/28282; H01L 21/768; H01L 23/5327; H01L 23/53209
  USPC .. 257/324, 532, 751, 316, E21.21, E29.309; 438/591, 637, 106, 261, 396
  See application file for complete search history.

(56) References Cited

U.S. PATENT DOCUMENTS

| | | | |
|---|---|---|---|
| 9,331,071 | B2 | 5/2016 | Sunamura et al. |
| 10,056,433 | B2 | 8/2018 | Kiyotoshi et al. |
| 2011/0156028 | A1 | 6/2011 | Yamazaki et al. |
| 2013/0234130 | A1* | 9/2013 | Ino ....................... H01L 29/792 257/43 |
| 2014/0175426 | A1 | 6/2014 | Tsang |
| 2017/0213843 | A1* | 7/2017 | Choi ....................... H01L 28/00 |
| 2018/0122823 | A1* | 5/2018 | Li ..................... H01L 27/11582 |
| 2018/0269210 | A1* | 9/2018 | Tezuka ................ H01L 27/1225 |
| 2018/0277560 | A1* | 9/2018 | Zushi ................ H01L 29/40117 |
| 2018/0331116 | A1* | 11/2018 | Tezuka ................... G11C 16/10 |
| 2018/0350829 | A1 | 12/2018 | Tezuka et al. |
| 2019/0067326 | A1* | 2/2019 | Huang .............. H01L 21/02532 |

FOREIGN PATENT DOCUMENTS

| | | |
|---|---|---|
| JP | 5960000 B2 | 8/2016 |
| JP | 6100071 B2 | 3/2017 |
| JP | 2018-157205 A | 10/2018 |

\* cited by examiner

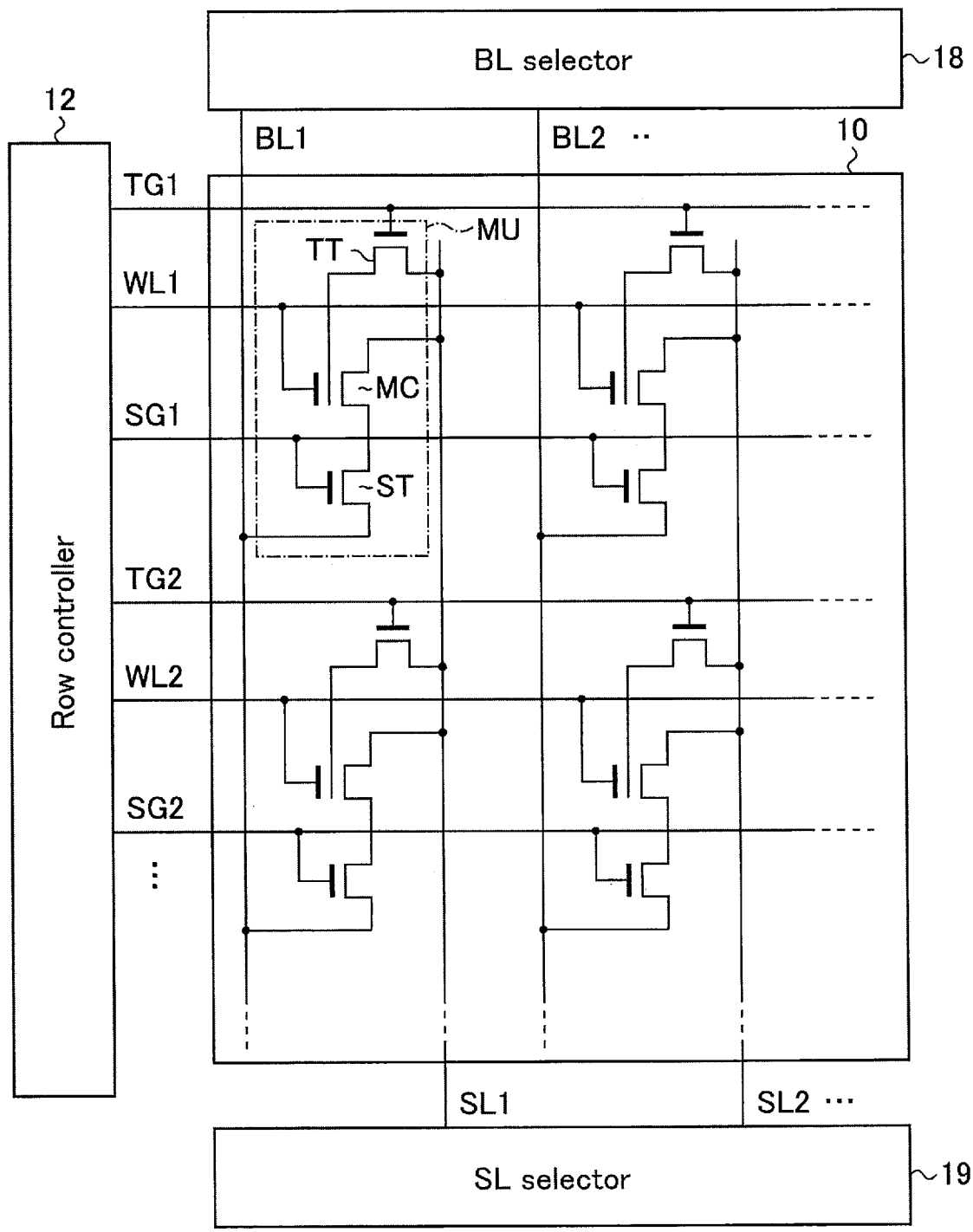
F I G. 2

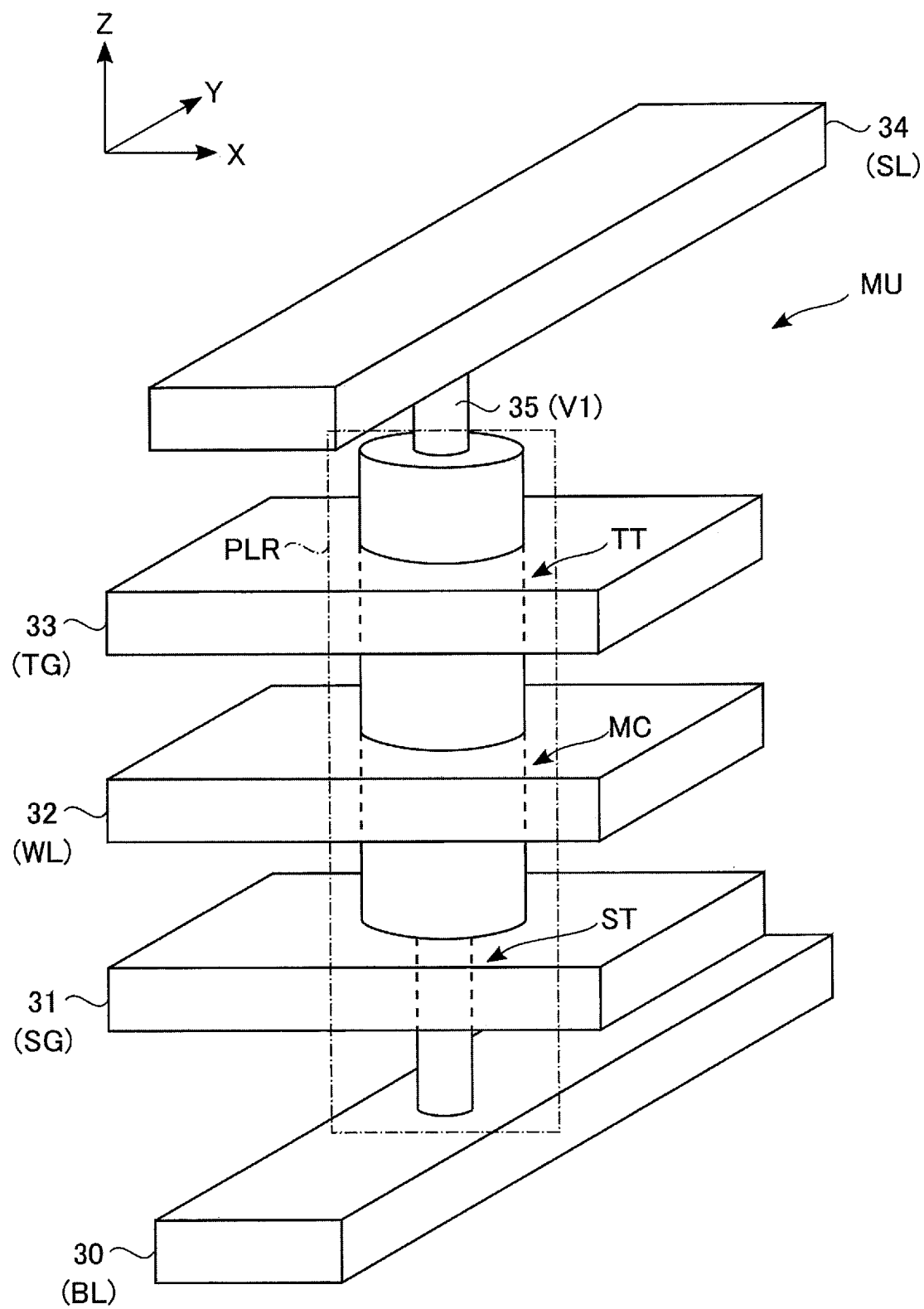
F I G. 3

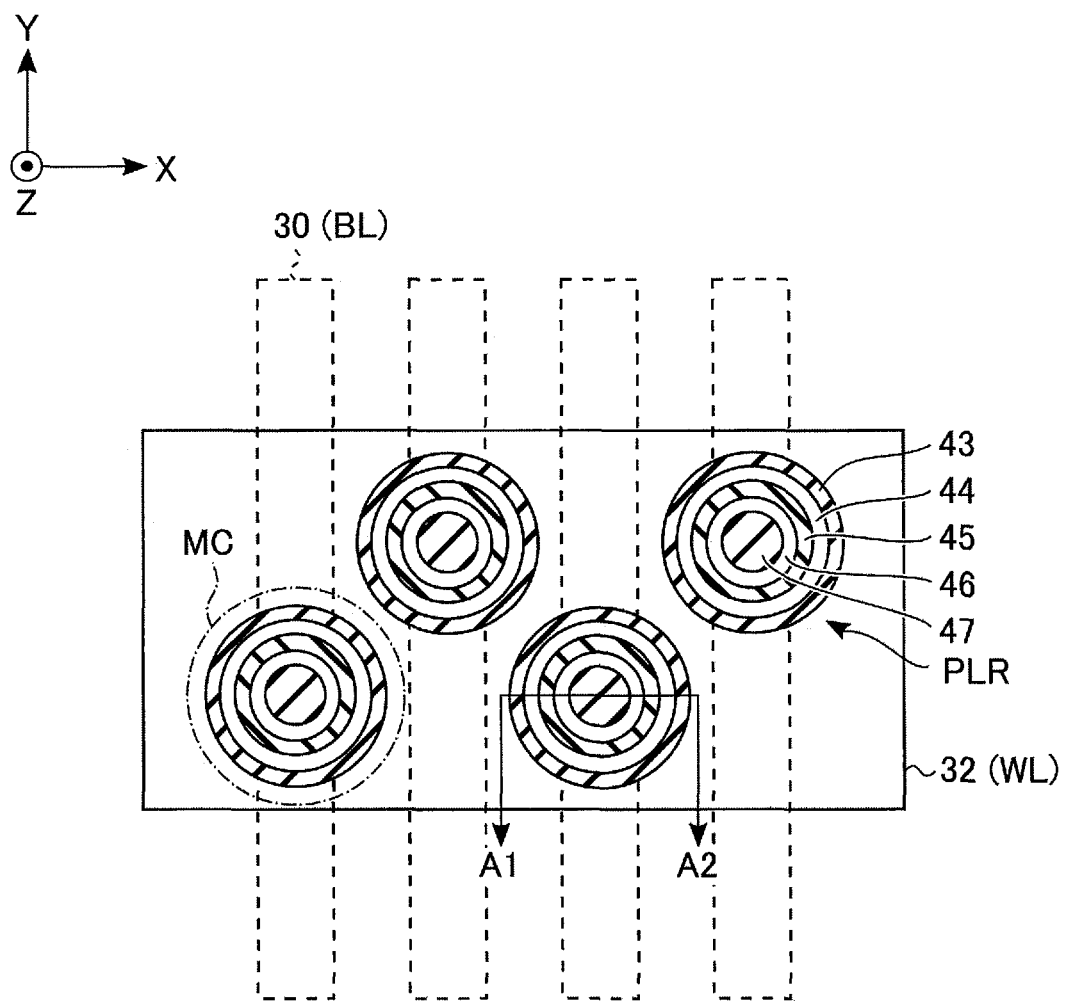
F I G. 4

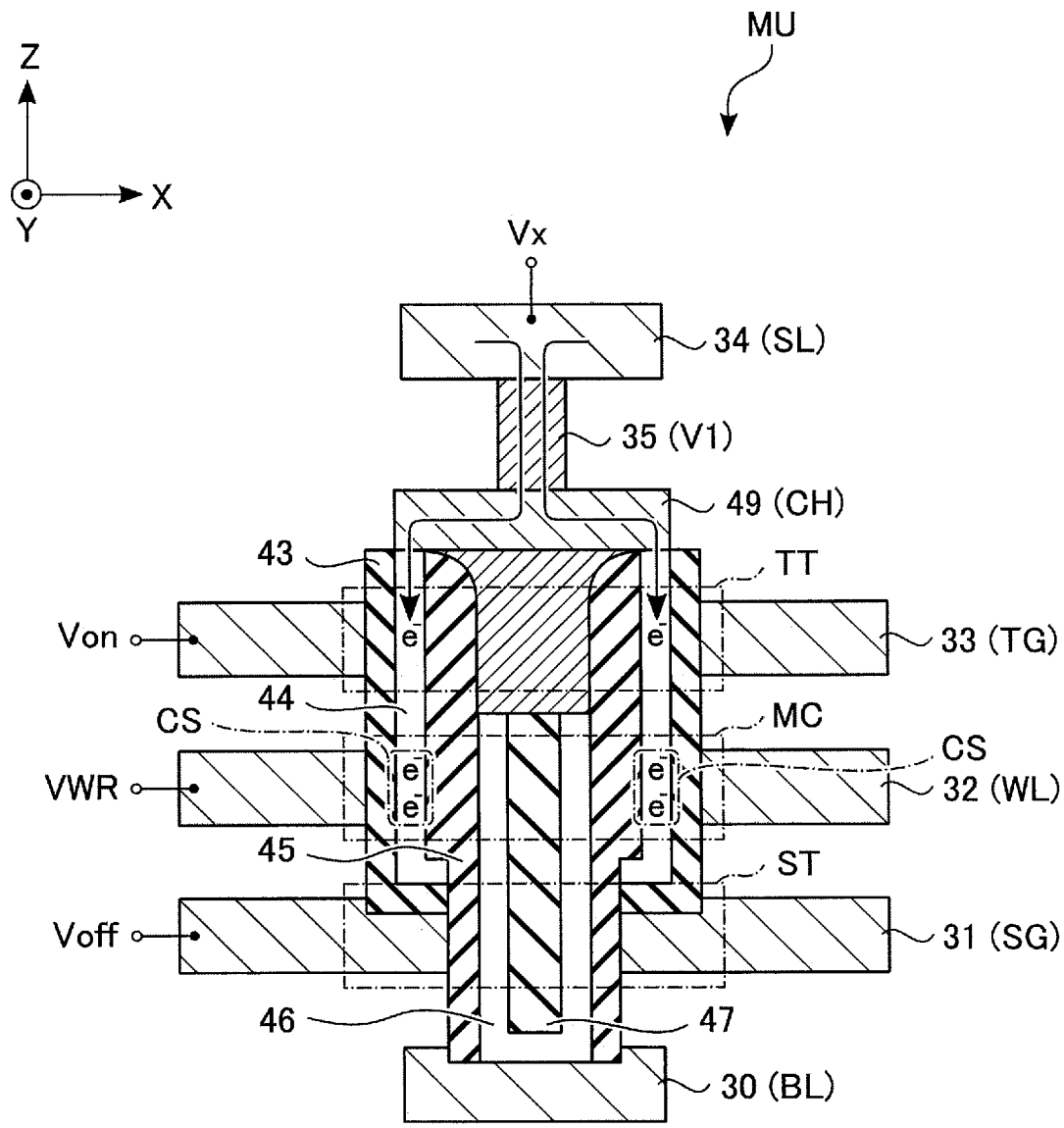
F I G. 7

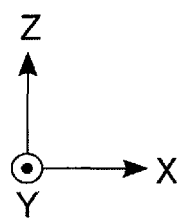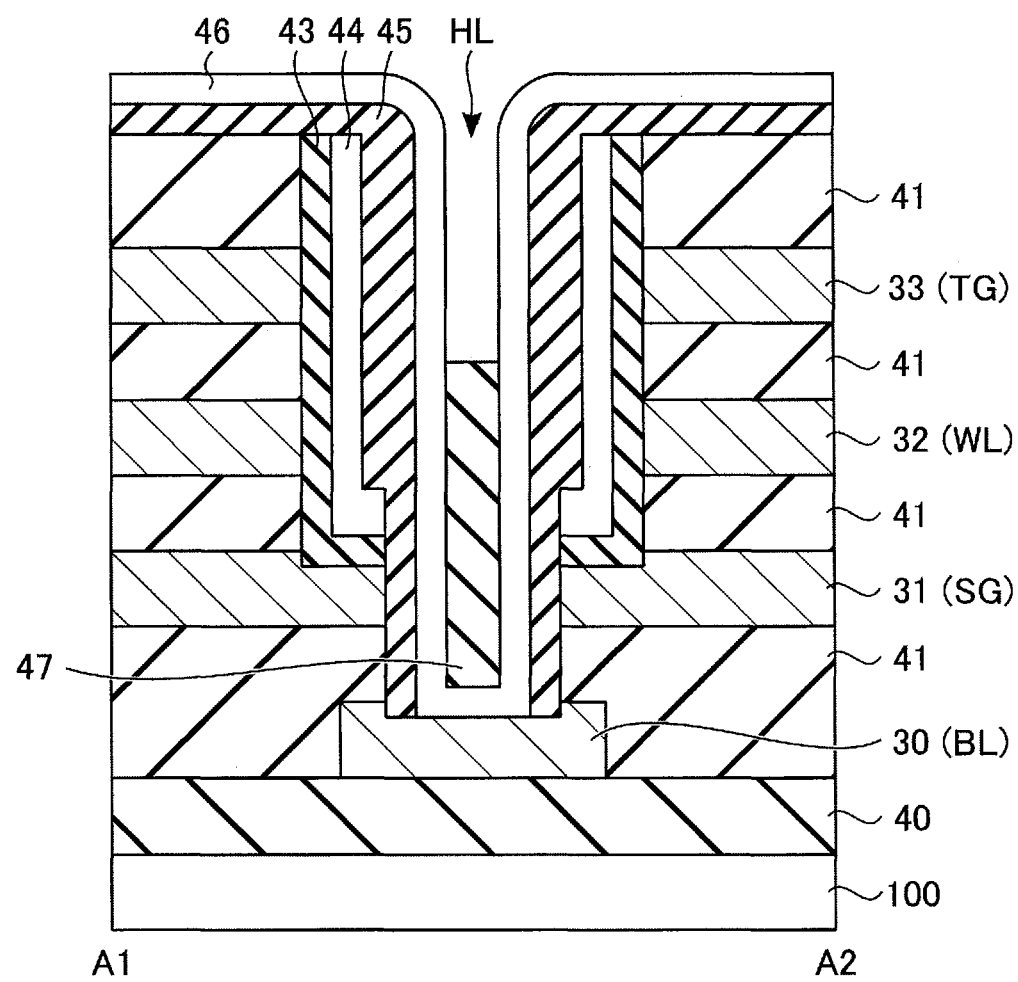
F I G. 16

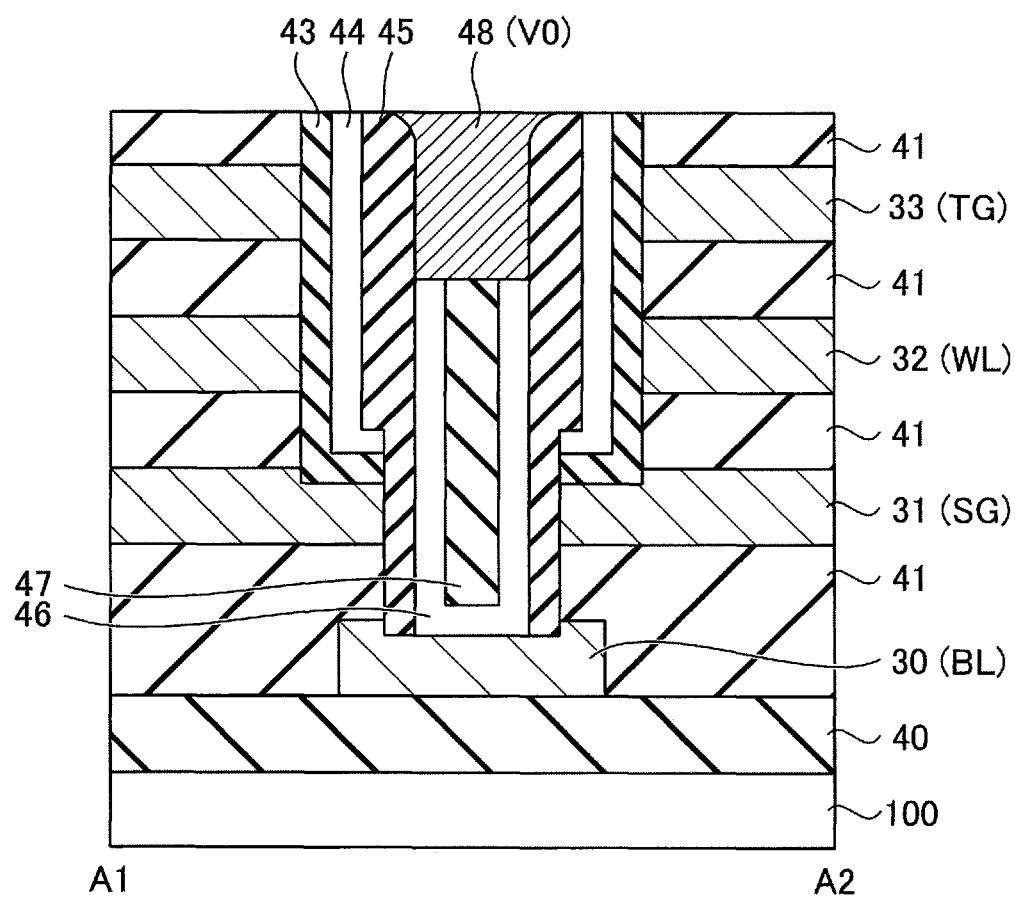
F I G. 18

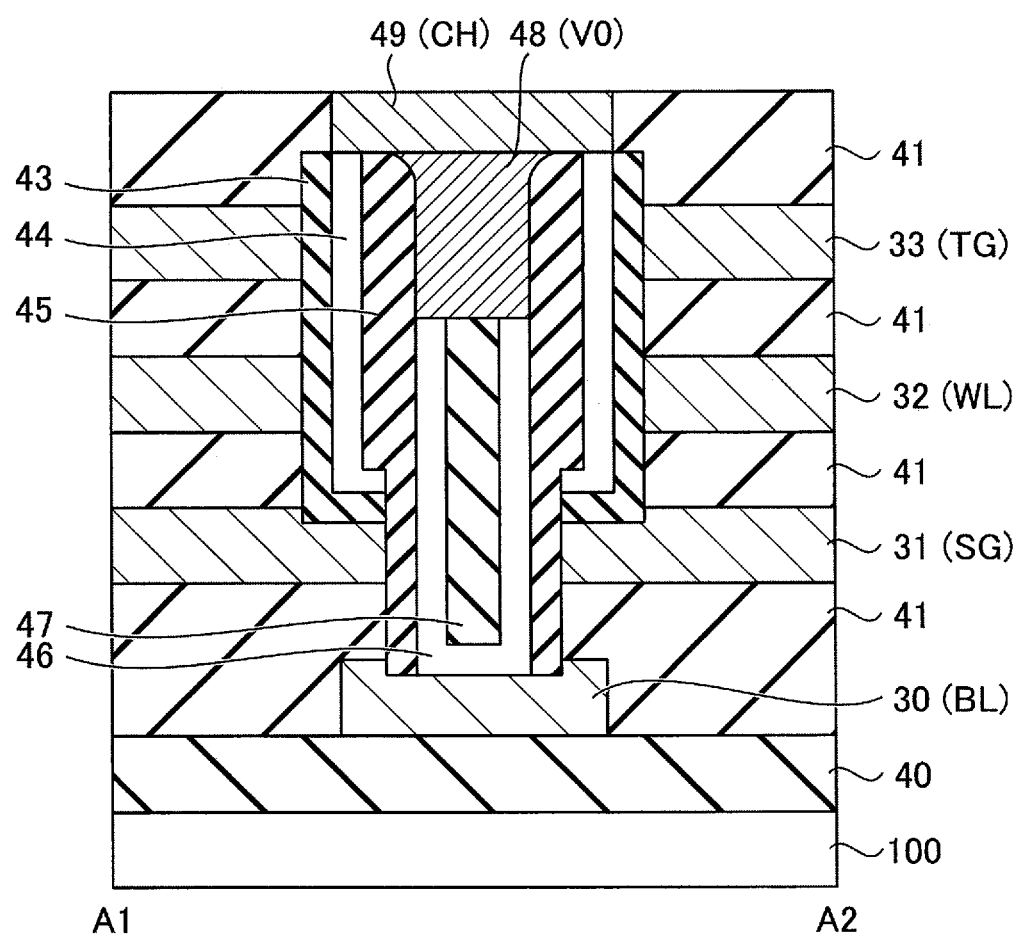
F I G. 19

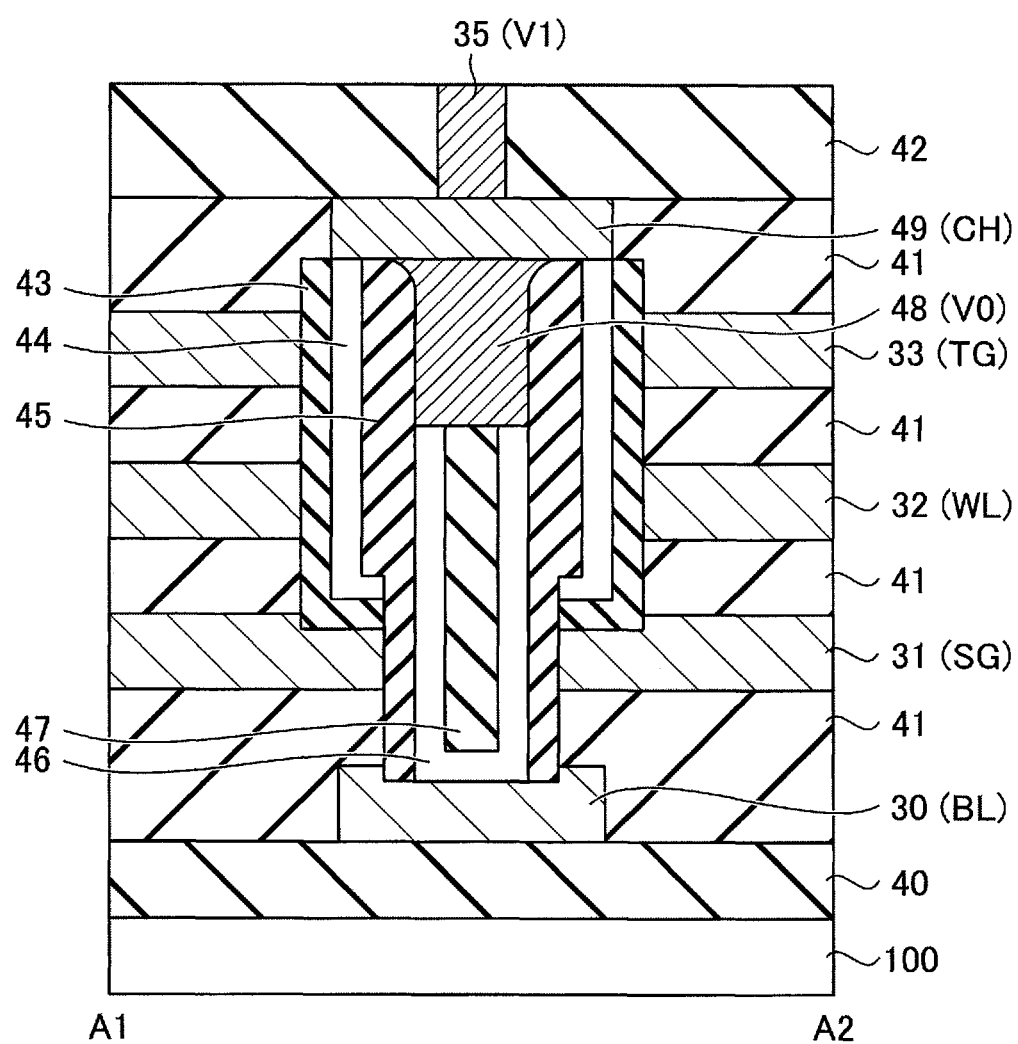
F I G. 20

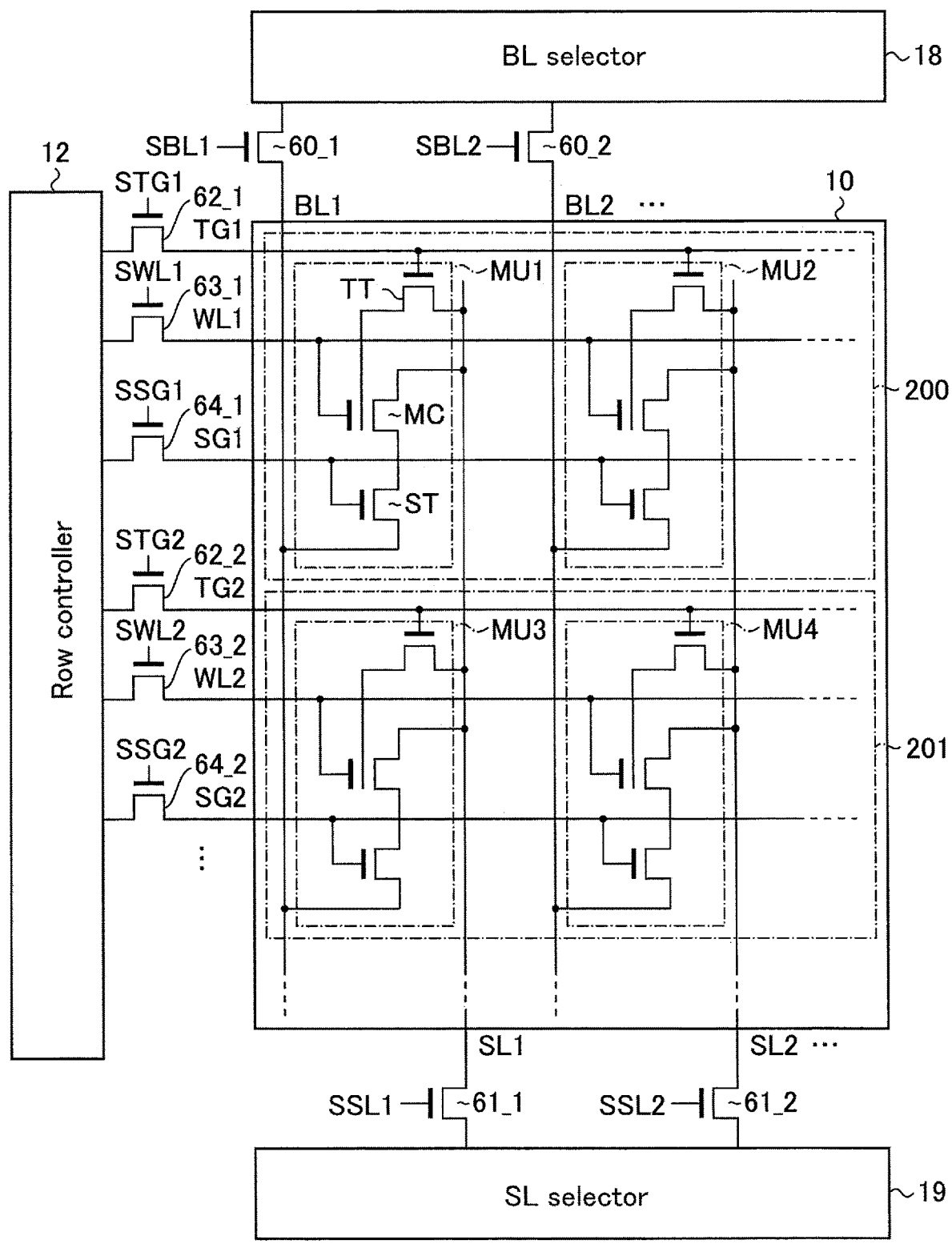
F I G. 23

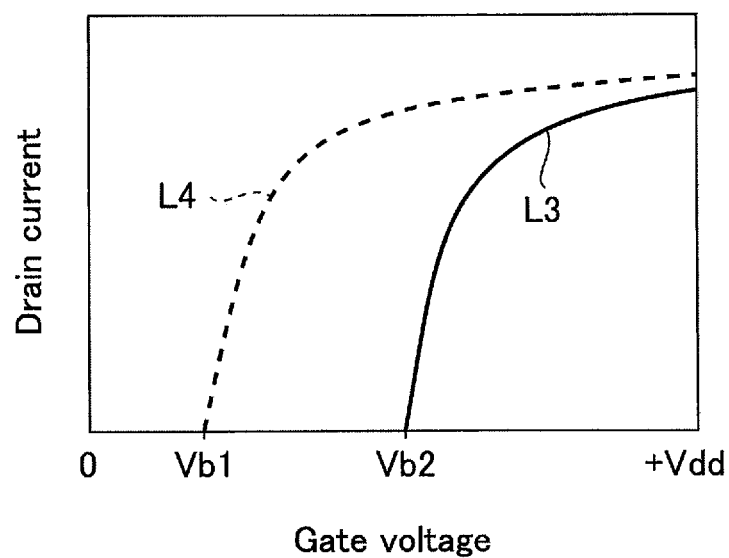
F I G. 26

SEMICONDUCTOR MEMORY DEVICE

CROSS-REFERENCE TO RELATED APPLICATIONS

This application is based upon and claims the benefit of priority from Japanese Patent Application No. 2018-205642, filed Oct. 31, 2018, the entire contents of which are incorporated herein by reference.

FIELD

Embodiments described herein relate generally to a semiconductor memory device.

BACKGROUND

The amount of data handled on information terminals, the Internet, and clouds, etc. has explosively increased in recent years. Accordingly, a large capacity for memory devices and reduction of the bit costs are required.

An ideal memory device is a non-volatile semiconductor memory device with high-speed performance, high storage density, and a low bit cost. Currently, there is no memory device that satisfies all these requirements, and a memory device suitable for the intended purpose is provided to a user.

BRIEF DESCRIPTION OF THE DRAWINGS

FIG. 2 is a circuit diagram of a memory cell array in the semiconductor memory device according to the first embodiment;

FIG. 3 is a perspective view of a memory unit in the semiconductor memory device according to the first embodiment;

FIG. 4 is a top view of a word line in the memory cell array in the semiconductor memory device according to the first embodiment;

FIG. 7 is a schematic diagram showing a write operation in the memory unit in the semiconductor memory device according to the first embodiment;

FIG. 12 to FIG. 20 are cross-sectional views showing a process of manufacturing the memory unit in the semiconductor memory device according to the first embodiment;

FIG. 23 is a circuit diagram of the memory cell array in the semiconductor memory device according to the third embodiment;

FIG. 26 is a graph showing V-I characteristics in a memory cell in a semiconductor memory device according to a fifth embodiment.

DETAILED DESCRIPTION

In general, according to one embodiment, a semiconductor memory device includes: a first interconnect; a second interconnect provided above the first interconnect in a first direction; a third interconnect provided between the first interconnect and the second interconnect in the first direction; a fourth interconnect provided between the second interconnect and the third interconnect in the first direction; a fifth interconnect provided between the second interconnect and the fourth interconnect in the first direction; a semiconductor layer extending in the first direction, and having one end located between the fourth interconnect and the fifth interconnect and other end connected to the first interconnect in the first direction; a memory cell storing information between the semiconductor layer and the fourth interconnect; a conductive layer extending in the first direction, and having one end connected to the second interconnect and other end connected to the semiconductor layer in the first direction; a first insulating layer extending in the first direction, and provided to extend between the third interconnect and the semiconductor layer, between the fourth interconnect and the semiconductor layer, and between the fifth interconnect and the conductive layer; an oxide semiconductor layer extending in the first direction, and provided to extend between the fourth interconnect and the first insulating layer and between the fifth interconnect and the first insulating layer; and a second insulating layer extending in the first direction, and provided to extend between the fourth interconnect and the oxide semiconductor layer and between the fifth interconnect and the oxide semiconductor layer.

1. First Embodiment

A semiconductor memory device according to a first embodiment will be described. The present embodiment will describe a case where an oxide semiconductor is used for a charge storing layer of a memory cell.

1.1 Configuration

1.1.1 Configuration of Semiconductor Memory Device

First, the entire configuration of a semiconductor memory device 1 will be described with reference to FIG. 1. In the example shown in FIG. 1, a part of the coupling between blocks is indicated by arrows, but the coupling between the blocks is not limited thereto.

Figure 1:
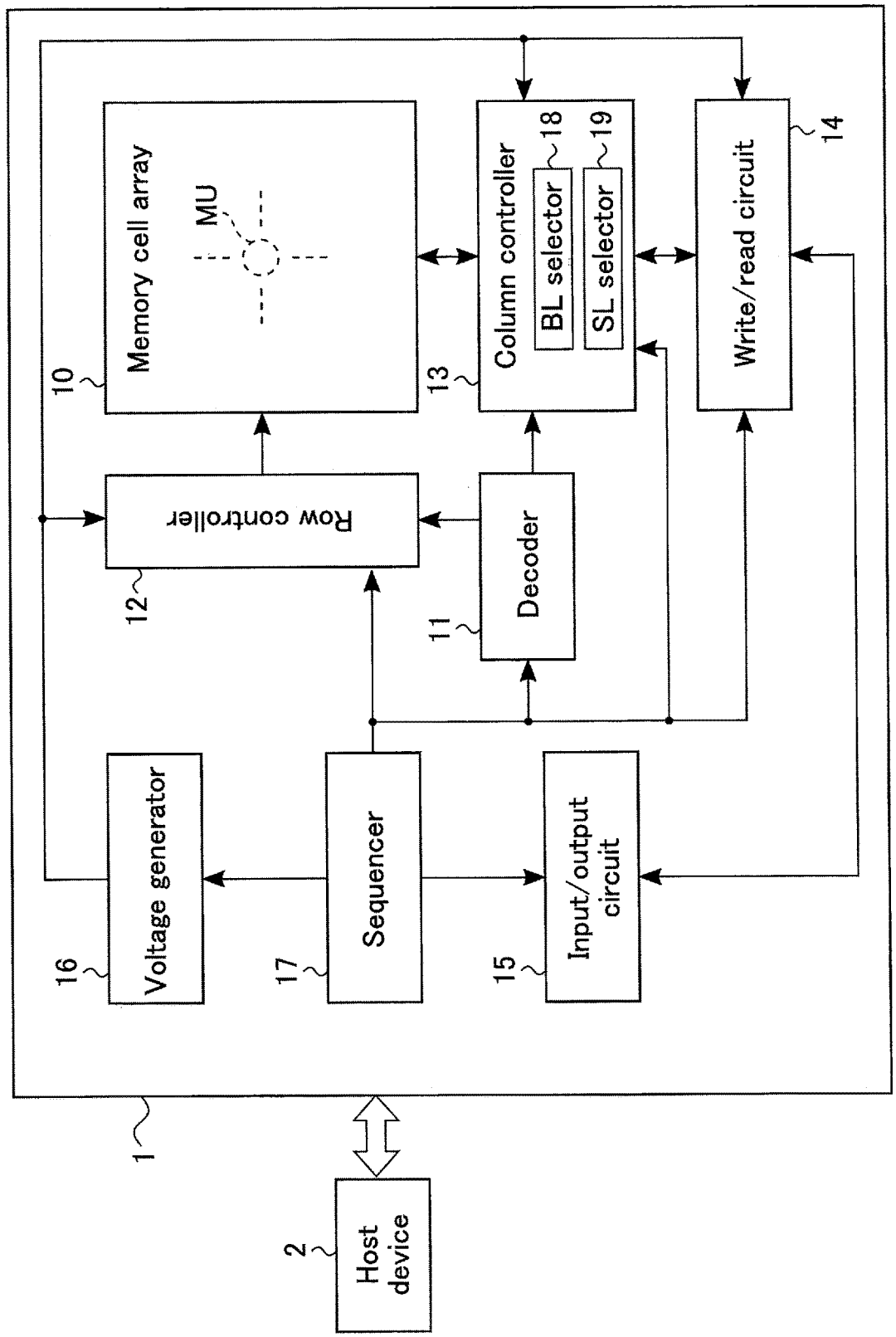
FIG. 1 is an overall view of a semiconductor memory device according to a first embodiment.

As shown in FIG. 1, the semiconductor memory device 1 is electrically coupled to a host device 2. The host device 2 is, for example, a memory controller or a processor (e.g., CPU).

The semiconductor memory device 1, for example, performs a read operation, a write operation, and an erase operation, etc. of data in response to a request (command) from the host device 2.

The host device 2 is provided outside the semiconductor memory device 1. The semiconductor memory device 1 may be provided inside the host device 2.

When operating the semiconductor memory device 1, the host device 2 transmits a command, an address, and various control signals to the semiconductor memory device 1. Specifically, for example, in a write operation of the semiconductor memory device 1, the host device 2 transmits, to the semiconductor memory device 1, data to be written (data to be stored) and a write command. For example, in a read operation of the semiconductor memory device 1, the host device 2 receives data read from the semiconductor memory device 1 as a response to a read command.

The semiconductor memory device 1 includes a memory cell array 10, a decoder 11, a row controller 12, a column controller 13, a write/read circuit 14, an input/output circuit 15, a voltage generator 16, and a sequencer 17.

The memory cell array 10 is constituted by one or more sub-arrays, for example. A sub-array includes a plurality of memory units MU that store data in a non-volatile manner. The sub-array includes a plurality of word lines, transfer gate lines, and select gate lines that are arranged along the row direction. The sub-array also includes a plurality of bit lines and source lines that are arranged along the column direction. The memory units MU are associated with respective word lines, transfer gate lines, select gate lines, bit lines, and source lines, and are arranged on a matrix of m×n (m and n are integers equal to 1 or more).

The decoder 11 decodes the address supplied from the host device 2. A row address in the memory cell array 10 and a column address in the memory cell array 10 are decoded by the decoder 11.

Based on the result of decoding the row address by the decoder 11, the row controller 12 controls the word lines, transfer gate lines, and select gate lines arranged in the row direction of the memory cell array 10. Specifically, the row controller 12 selects a sub-array based on the row address. Furthermore, the row controller 12 selects a row direction in the selected sub-array, and applies a voltage supplied from the voltage generator 16 to a word line, etc. For example, the row controller 12 includes a word line driver (a word line selector), etc.

Based on the result of column address decoding by the decoder 11, the column controller 13 controls the bit lines and source lines arranged in the column direction of the memory cell array 10. The column controller 13 includes a BL selector 18 and a SL selector 19.

The BL selector 18 selects one or more of the bit lines based on the column address.

The SL selector 19 selects one or more of the source lines based on the column address.

The write/read circuit 14 performs a write operation and a read operation of data to a selected memory unit MU in the memory cell array 10, based on the write command and the read command. For example, the write/read circuit 14 includes a data resistor, a write driver, a read driver, and a sense amplifier.

The input/output circuit 15 functions as an inner interface of the semiconductor memory device 1. The input/output circuit 15 receives data, a command, a control signal, and an address, etc. from the host device 2. The input/output circuit 15 transmits the data read from the memory cell array 10 to the host device 2. For example, the input/output circuit 15 includes a latch circuit that can temporarily hold data, a command, a signal, and an address.

The voltage generator 16 generates various voltages used for a write operation and a read operation, etc. The voltage generator 16 supplies the generated voltages to the row controller 12, the column controller 13, and the write/read circuit 14, etc.

The sequencer 17 controls operations of the circuits 10 to 16 in the semiconductor memory device 1 to perform operation requested by the host device 2, based on the command and the control signal.

1.1.2 Circuit Configuration of Memory Cell Array

Next, a circuit configuration of the memory cell array 10 will be described with reference to FIG. 2. In order to simplify the description, the example of FIG. 2 shows memory units MU of the m×n memory units MU in the memory cell array 10 in an arrangement of 2×2 (m=n=2). In the following description, either one of a source and a drain of a transistor will be referred to as "one end of the transistor", and the other will be referred to as "the other end of the transistor".

As shown in FIG. 2, a plurality of (herein, four) memory units MU are arranged along the row direction and the column direction in the memory cell array 10.

Corresponding to the number of memory units MU arranged in the row direction, a plurality of (herein, two) bit lines BL (BL1 and BL2) are provided in the memory cell array 10. To each bit line BL, a plurality of (herein, two) memory units MU arranged in the column direction are coupled in common. One end of each bit line BL is coupled to the BL selector 18.

Corresponding to the number of the memory units MU arranged in the row direction, a plurality of (herein, two) source lines SL (SL1 and SL2) are provided in the memory cell array 10. To each source line SL, the plurality of (herein, two) memory units MU arranged in the column direction are coupled in common. One end of each source line SL is coupled to the SL selector 19.

Corresponding to the number of the memory units MU arranged in the column direction, a plurality of (herein, two) transfer gate lines TG (TG1 and TG2) are provided in the memory cell array 10. To each transfer gate line TG, the plurality of (herein, two) memory units MU arranged in the row direction are coupled in common. One end of each transfer gate line TG is coupled to the row controller 12.

Corresponding to the number of the memory units MU arranged in the column direction, a plurality of (herein, two) select gate lines SG (SG1 and SG2) are provided in the memory cell array 10. To each select gate line SG, the plurality of (herein, two) memory units MU arranged in the row direction are coupled in common. One end of each select gate line SG is coupled to the row controller 12.

Corresponding to the number of the memory units MU arranged in the column direction, a plurality of (herein, two) word lines WL (WL1 and WL2) are provided in the memory cell array 10. To each word line WL, the plurality of (herein, two) memory units MU arranged in the row direction are coupled in common. One end of each word line WL is coupled to the row controller 12.

Next, a memory unit MU will be described.

A memory unit MU includes a memory cell MC, a transfer transistor TT, and a select transistor ST.

The memory cell MC includes a control gate and a charge storing layer CS, and holds data in a non-volatile manner. In other words, the memory cell MC is a field-effect transistor having a stacked gate structure. The memory cell MC can hold data of 1 bit or more. For example, an oxide semiconductor is used for the charge storing layer CS. In other words, the charge storing layer CS according to the present embodiment is a floating gate using an oxide semiconductor. One end of the memory cell MC is coupled to the source line SL; the other end is coupled to one end of the select transistor ST. The gate of the memory cell MC is coupled to the word line WL, and the charge storing layer CS is coupled to one end of the transfer transistor TT.

A write operation of data is performed to a plurality of memory cells MC (memory units MU) coupled to any one of the word lines WL, all together.

The transfer transistor TT functions as an element for controlling a data holding state of the memory cell MC. For example, in a write operation and an erase operation, the electrical charges in the charge storing layer CS of the memory cell MC are charged and discharged (transferred) via the transfer transistor TT. In a write operation and an erase operation, the transfer transistor TT functions as a select element for selecting a memory unit MU in the column direction.

The other end of the transfer transistor TT is coupled to the source line SL, and the gate of the transfer transistor TT is coupled to the transfer gate line TG. In other words, the charge storing layer CS of the memory cell MC is coupled to the source line SL via the channel region of the transfer transistor TT.

In a read operation, the select transistor ST is used when selecting one of the plurality of memory units MU arranged in the column direction. The other end of the select transistor ST is coupled to the bit line BL, and the gate of the select transistor ST is coupled to the select gate line SG.

1.1.3 Entire Configuration of Memory Unit MU

Next, the entire configuration of the memory unit will be described with reference to FIG. 3. FIG. 3 a perspective view of the memory unit MU. In the example shown in FIG. 3, insulating layers are not shown.

As shown in FIG. 3, for example, on an XY plane formed by an X-axis direction and a Y-axis direction orthogonal to the X-axis direction, an interconnect layer 30 extending in the Y-axis direction is provided. The interconnect layer 30 functions as a bit line BL. Above the interconnect layer 30 with respect to a Z-axis direction orthogonal to the XY plane, three interconnect layers 31 to 33 extending in the X-axis direction are stacked in this order so as to be separated from each other in the Z-axis direction; in other words, stacked in this order, with insulating layers (not shown) being interposed therebetween. The interconnect layer 31 functions as a select gate line SG. The interconnect layer 32 functions as a word line WL. The interconnect layer 33 functions as a transfer gate line TG. Above the interconnect layer 33 with respect to the Z-axis direction, an interconnect layer 34 extending in the Y-axis direction is provided so as to be separated from the interconnect layer 33 in the Z-axis direction. The interconnect layer 34 functions as a source line SL.

A pillar PLR, which penetrates the interconnect layers 31 to 33 and has a bottom surface in contact with the interconnect layer 30, is provided to extend in the Z-axis direction. One pillar PLR corresponds to one memory unit MU. Provided A conductive layer 35 having a top surface in contact with the bottom surface of the interconnect layer 34, is provided on the top surface of the pillar PLR. The conductive layer 35 functions as a contact plug V1 that electrically couples the pillar PLR and the interconnect layer 34.

A select transistor ST is provided at the position (intersection) where the interconnect layer 31 intersects the pillar PLR. Similarly, a memory cell MC is provided at the position where the interconnect layer 32 intersects the pillar PLR. A transfer transistor TT is provided at the position where the interconnect layer 33 intersects the pillar PLR.

1.1.4 Planar Configuration of Memory Cell Array

Next, a planar configuration of the memory cell array 10 is described with reference to FIG. 4. FIG. 4 shows a top surface of the interconnect layer 32 (word line WL) on the XY plane.

As shown in FIG. 4, the interconnect layer 31 (not shown), the interconnect layer 32, and the interconnect layer 33 (not shown) extending in the X-axis direction are provided above a plurality of interconnect layers 30 (bit lines BL) extending in the Y-axis direction. In the interconnect layer 32, a plurality of pillars PLR arranged on respective interconnect layers 30 and penetrating the interconnect layer 32 (and the interconnect layers 31 and 33) are provided.

The example in FIG. 4 shows a case where the pitch of the interconnect layers 30 in the X-axis direction is the same as the pitch of the central axes of the pillars PLR in the X-axis direction. In other words, one interconnect layer 30 is arranged below a pillar PLR. The interconnect layers 34 (source lines SL: not shown) are arranged above the pillars PLR at the same pitch as the interconnect layers 30. In other words, one interconnect layer 34 is arranged above a pillar PLR.

The plurality of pillars PLR are arranged in a staggered line in the X-axis direction. For example, a first pillar PLR and a second pillar PLR are adjacently arranged in the X-axis direction; a third pillar PLR is arranged between the first pillar PLR and the second pillar PLR with respect to the X-axis direction; and the third pillar PLR is arranged at a different position from the first pillar PLR and the second pillar PLR with respect to the Y-axis direction. The plurality of pillars PLR may be arranged in a line along the X-axis direction. A width of the interconnect layer 30 (and the interconnect layer 34) in the X-axis direction can be discretionarily set. A width of the interconnect layer 30 (and 34) in the X-axis direction may be smaller or larger than a diameter of a pillar PLR in the X-axis direction.

A cross-section of the pillar PLR along the top surface of the interconnect layer 32 has a circular shape on the XY plane, for example. For example, the pillar PLR includes a plurality of layers (films) arranged concentrically around the Z-axis direction as a central axis. For example, the pillar PLR includes layers 43 to 47. Specifically, a plurality of layers 46, 45, 44, and 43 are provided in this order between the interconnect layer 32 and a layer 47 at the center (axial portion) of the pillar PLR.

The layer 47 has a circular shape on the XY plane, for example. The layer 47 is made of an insulator. For example, the layer 47 is made of silicon dioxide ($SiO_2$). The layer 47 will also be referred to as an "insulating layer 47".

The layer 46 is provided on the side surface of the layer 47 (an outer peripheral surface of the layer 47 as seen on a surface in a direction parallel to the XY plane; thus, hereinafter also referred to as an "outer peripheral surface"). The layer 46 is provided between the layer 47 and the layer 45. The layer 46 is a semiconductor layer. The layer 46 will also be referred to as a "semiconductor layer 46". The semiconductor layer 46 is a region where a channel is formed in a memory cell MC.

The material for the semiconductor layer 46 is selected from polycrystalline silicon (Si), polycrystalline germanium (Ge), polycrystalline silicon germanium (SiGe), an oxide semiconductor (for example, InGaZnO), and a two-dimensional semiconductor material (for example, $MoS_2$ or $WSe_2$), etc. The semiconductor layer 46 may be constituted from a multi-layered film including at least two films made of these materials (e.g., a multi-layered film made of silicon and germanium) or a multi-layered film of a plurality of two-dimensional semiconductor materials.

The layer 45 is provided on the side surface (outer peripheral surface) of the layer 46. The layer 45 is provided between the layer 46 and the layer 44. The layer 45 is made of an insulator. The layer 45 will also be referred to as an insulating layer 45. The insulating layer 45 functions as a tunnel insulating film in the memory cell MC. For example, the film thickness of the tunnel insulating film (insulating layer 45) on the XY plane is set within a range from about 1 nm to about 10 nm. For example, the film thickness of the tunnel insulating film on the XY plane is preferably set within a range from 3 nm to 7 nm.

The material for the insulating layer 45 is selected from $SiO_2$, silicon nitride (SiN), silicon oxynitride (SiON), a high-dielectric material (e.g., aluminum oxide ($AlO_x$), hafnium oxide ($HfO_x$), or zirconium oxide ($ZrO_x$)), for example. The insulating layer 45 may be a mixture film of these materials or a multi-layered film thereof.

The layer 44 is provided on the side surface (outer peripheral surface) of the layer 45. The layer 44 is provided between the layer 45 and the layer 43. The layer 44 is made of an oxide semiconductor. The layer 44 will also be referred to as an "oxide semiconductor layer 44". The oxide semiconductor layer 44 functions as a charge storing layer CS in the memory cell MC. For example, the film thickness of the charge storing layer CS (oxide semiconductor layer 44) on the XY plane is set within the range from 1 nm to 15 nm. For example, the film thickness of the charge storing layer CS on the XY plane is preferably set within the range from 3 nm to 10 nm.

The material for the oxide semiconductor layer 44 is an oxide of indium (In), gallium (Ga), zinc (Zn) or tin (Sn), etc., or a mixture (compound) of such oxides. For example, the material for the oxide semiconductor layer 44 is InGaZnO, or InGaSnO, etc. The semiconductor layer 46 may be made of the material used for the oxide semiconductor layer 44.

The layer 43 is provided on the side surface (outer peripheral surface) of the layer 44. The layer 43 is provided between the layer 44 and the interconnect layer 32. The layer 43 is made of an insulator. The layer 43 will also be referred to as an "insulating layer 43". The insulating layer 43 functions as a block insulating film in the memory cell MC. For example, the film thickness of the block insulating film (insulating layer 43) on the XY plane is set to be approximately equal to the film thickness of the tunnel insulating film. The film thickness of the block insulating film may differ from the film thickness of the tunnel insulating film.

For example, the insulating layer 43 is made of the same material as the insulating layer 45. The insulating layer 43 may be made of a different material from the insulating layer 45.

1.1.5 Cross-Sectional Configuration of Memory Unit

Figure 5:
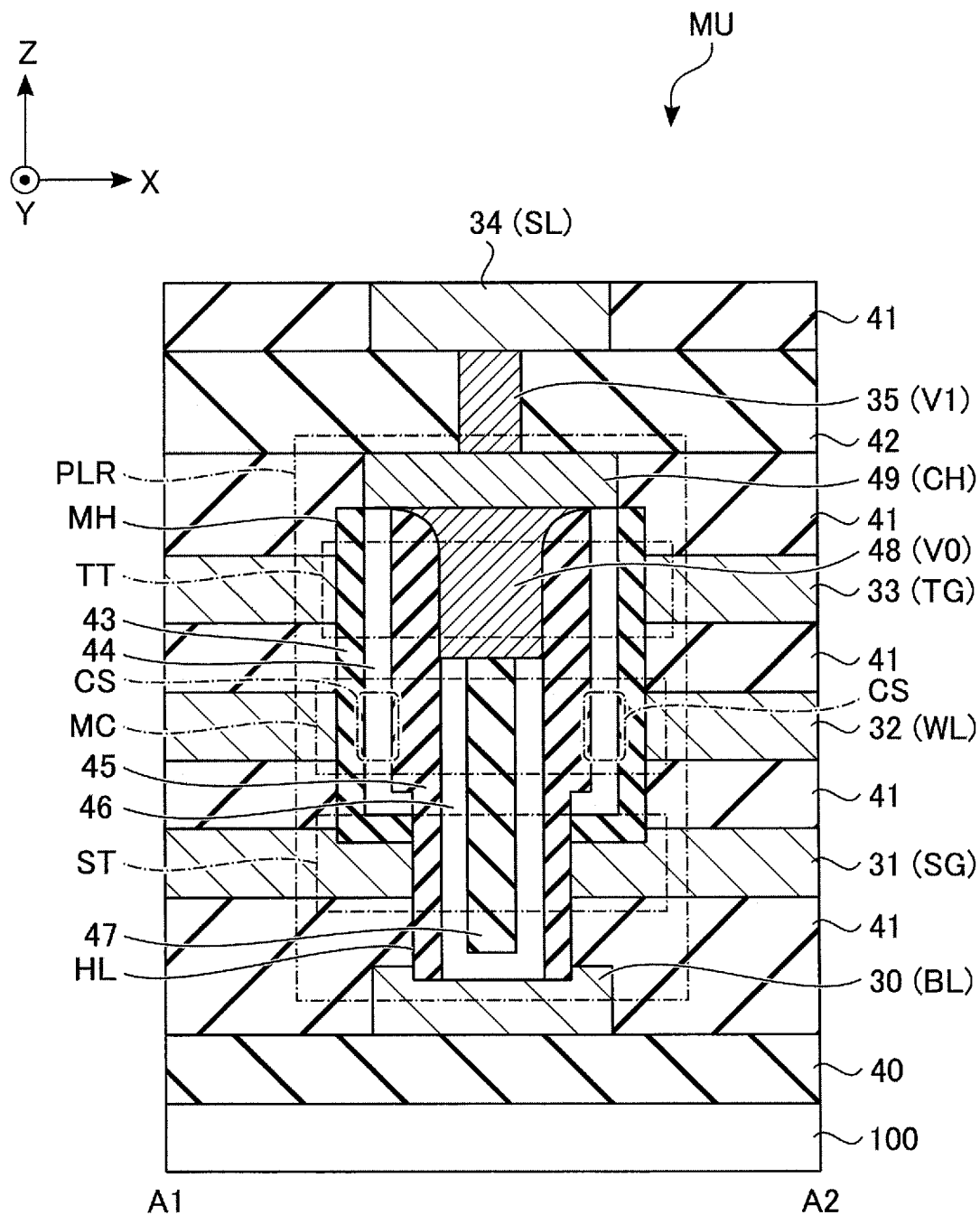
FIG. 5 is a cross-sectional view of the memory unit in the semiconductor memory device according to the first embodiment.

Next, a cross-sectional configuration of the memory cell array 10 will be described with reference to FIG. 5. FIG. 5 is a cross-sectional view of the memory unit MU taken along line A1-A2 shown in FIG. 4.

As shown in FIG. 5, an insulating layer 40 is formed on a semiconductor substrate 100. The insulating layer 40 is made of $SiO_2$, for example. A circuit, such as the row controller 12 or the column controller 13, may be provided in a region where the insulating layer 40 is formed, namely, between the semiconductor substrate 100 and the interconnect layer 30.

On the insulating layer 40, an insulating layer 41 and the interconnect layer 30 are provided. The insulating layer 41 is made of $SiO_2$, for example.

The interconnect layer 30 extends in the Y-axis direction. The interconnect layer 30 is made of a conductive material. For example, the interconnect layer 30 is a single-layer film or a multi-layered film that includes at least one of a semiconductor to which impurities are doped, metal (e.g., tungsten (W), copper (Cu), aluminum (Al), titanium (Ti), or tantalum (Ta)), or a conductive compound (e.g., titanium nitride (TiN), tantalum nitride (TaN), or tungsten nitride (WN)).

Above the interconnect layer 30, the interconnect layers 31 to 33 extending in the X-axis direction are stacked in this order, with insulating layers 41 being interposed therebetween.

The interconnect layers 31 to 33 are made of a conductive material. For example, each of the interconnect layers 31 to 33 is a single-layer film or a multi-layered film that includes at least one of a semiconductor to which impurities are doped, metal (e.g., W, Cu, Al, Ti, or Ta), or a conductive compound (e.g., TiN, TaN, or WN). The interconnect layers 31 to 33 may be made of the same conductive material or different conductive materials.

An insulating layer 41 is formed on the interconnect layer 33, and an insulating layer 42 is formed on the insulating layer 41. The insulating layer 42 is made of $SiO_2$, for example.

On the insulating layer 42, an insulating layer 41 and the interconnect layer 34 are formed. The interconnect layer 34 extends in the Y-axis direction. The interconnect layer 34 is made of a conductive material. For example, the interconnect layer 34 is a single-layer film or a multi-layered film that includes at least one of a semiconductor to which impurities are doped, metal (e.g., W, Cu, Al, Ti, or Ta), or a conductive compound (e.g., TiN, TaN, or WN).

A memory hole MH is formed to penetrate through the insulating layer 41 provided on the interconnect layer 31, the interconnect layer 32, the insulating layer 41 provided on the interconnect layer 32, and the interconnect layer 33, and so as to have a bottom surface in contact with the interconnect layer 31. On the side surface and a part of the bottom surface of the memory hole MH, the insulating layer 43 and the oxide semiconductor layer 44 are stacked in this order.

The bottom surface (one end) of the oxide semiconductor layer 44 is higher than the top surface of the interconnect layer 31 and lower than the bottom surface of the interconnect layer 32 with respect to the Z-axis direction. The top surface (the other end) of the oxide semiconductor layer 44 is higher than the top surface of the interconnect layer 33, and can be electrically coupled to the interconnect layer 34 (source line SL).

A hole HL is formed to penetrate the insulating layer 41 on the interconnect layer 30, the interconnect layer 31, and the memory hole MH, and so as to have a bottom surface in contact with the interconnect layer 30. Accordingly, the diameter of the hole HL is smaller than the diameter of the memory hole MH on the XY plane. The insulating layer 45 is formed on the side surface of the hole HL. In other words, the side surface of the insulating layer 45 is in contact with the side surface of the oxide semiconductor layer 44, a part of the bottom surface of the insulating layer 43, the side surface of the interconnect layer 31, and the side surface of the insulating layer 41 provided on the interconnect layer 31.

In the lower part in the hole HL, the semiconductor layer 46 is formed to have a side surface in contact with a part of the side surface of the insulating layer 45, and to have a bottom surface (one end) in contact with the interconnect layer 30. The top surface (the other end) of the semiconductor layer 46 is higher than the top surface of the interconnect layer 32 and lower than the bottom surface of the interconnect layer 33 with respect to the Z-axis direction.

The insulating layer 47 is formed to fill the inside of the semiconductor layer 46; in other words, it is formed in such a manner that the side surface and the bottom surface of the insulating layer 47 are in contact with the semiconductor layer 46.

In the upper part in the hole HL, a conductive layer 48 is formed to have a side surface in contact with a part of the side surface of the insulating layer 45, and to have a bottom surface in contact with the top surface of the semiconductor layer 46 and the top surface of the insulating layer 47. The bottom surface of the conductive layer 48 is higher than the top surface of the interconnect layer 32, and lower than the bottom surface of the interconnect layer 33 with respect to the Z-axis direction. The top surface of the conductive layer 48 is at approximately the same level as the top surface of the oxide semiconductor layer 44 with respect to the Z-axis direction. The conductive layer 48 functions as a contact plug V0 for electrically coupling the oxide semiconductor layer 44, the semiconductor layer 46, and the interconnect layer 34 (source line SL). The conductive layer 48 is made of a conductive material. For example, the conductive layer 48 is a single-layer film or a multi-layered film that includes at least one of a semiconductor to which impurities are doped, metal (e.g., tungsten (W), copper (Cu), aluminum (Al), titanium (Ti), and tantalum (Ta)), or a conductive compound (e.g., titanium nitride (TiN), tantalum nitride (TaN), and tungsten nitride (WN)).

A conductive layer 49 is formed on the oxide semiconductor layer 44 and the conductive layer 48. The lower surface of the conductive layer 49 is in contact with the insulating layer 45. The lower surface of the conductive layer 49 is not necessarily in contact with the insulating layer 45. The conductive layer 49 functions as a contact plug CH for electrically coupling the oxide semiconductor layer 44 and the conductive layer 48 to the interconnect layer 34 (source line SL). The conductive layer 49 is made of a conductive material. For example, the conductive layer 49 is a single-layer film or a multi-layered film that includes at least one of a semiconductor to which impurities are added, metal (e.g., W, Cu, Al, Ti, and Ta), or a conductive compound (e.g., TiN, TaN, and WN).

On the conductive layer 49, the conductive layer 35 having a top surface in contact with the bottom surface of the interconnect layer 34 is provided. The conductive layer 35 is made of a conductive material. For example, the conductive layer 35 is a single-layer film or a multi-layered film that includes at least one of a semiconductor to which impurities are added, metal (e.g., W, Cu, Al, Ti, and Ta), or a conductive compound (e.g., TiN, TaN, and WN).

The conductive layers 48, 49, and 35 may be made of one conductive layer. In this case, for example, the conductive layer 48 may be referred to as a "first portion", the conductive layer 49 may be referred to as a "second portion", and the conductive layer 35 may be referred to as a "third portion". The conductive layer 35 (contact plug V1) may be omitted. For example, the conductive layer 35 may be omitted if the width of the source line is sufficiently larger than the diameter of the conductive layer 49 (contact plug CH) with respect to the X-axis direction.

A pillar PLR includes the aforementioned insulating layer 43, oxide semiconductor layer 44, insulating layer 45, semiconductor layer 46, insulating layer 47, and conductive layers 48 and 49.

A memory cell MC is formed at the intersection of the pillar PLR and the interconnect layer 32. The oxide semiconductor layer 44 functions as a charge storing layer CS of the memory cell MC. A channel of the memory cell MC is formed in the semiconductor layer 46.

A select transistor ST is formed at the intersection of the pillar PLR and the interconnect layer 31. A channel of the select transistor ST is formed in the semiconductor layer 46. The oxide semiconductor layer 44 is not provided at the intersection of the pillar PLR and the interconnect layer 31. Accordingly, the select transistor ST is a transistor that does not include a floating gate.

A transfer transistor TT is formed at the intersection of the pillar PLR and the interconnect layer 33. A channel of the transfer transistor TT is formed in the oxide semiconductor layer 44. At the intersection of the pillar PLR and the interconnect layer 33, the semiconductor layer 46 is not provided, and the conductive layer 48 coupled to the semiconductor layer 46 is provided. Thus, the oxide semiconductor layer 44 in the transfer transistor TT does not function as a floating gate.

1.2 Characteristics of Memory Cell

Figure 6:
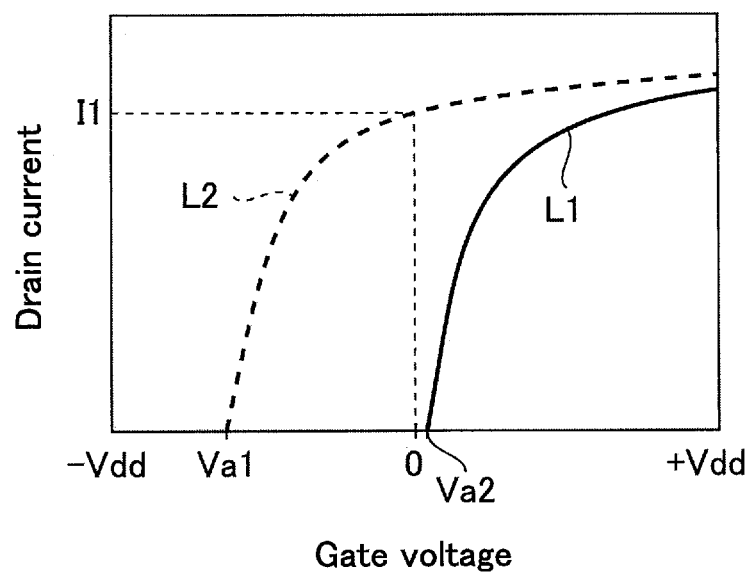
FIG. 6 is a graph showing V-I characteristics of a memory cell in the semiconductor memory device according to the first embodiment.

Next, characteristics of the memory cell MC will be described with reference to FIG. 6. FIG. 6 is a graph showing V-I characteristics of the memory cell MC.

In FIG. 6, the horizontal axis of the graph corresponds to a gate voltage of the memory cell MC (transistor), and the vertical axis of the graph corresponds to a drain current of the memory cell MC. The characteristic line (solid line) L1 indicates the V-I characteristics of the transistor in a state where electrons are stored in the charge storing layer CS of the memory cell MC (accumulated state). The characteristic line (dashed line) L2 indicates the V-I characteristics of the transistor in a state where electrons are not stored in the charge storing layer CS of the memory cell MC (a depletion state).

As shown in FIG. 6, the memory cell MC is a transistor of a normally-on type when electrical charges are not stored in the charge storing layer CS (oxide semiconductor layer 44) (a depletion state). Thus, as indicated by the characteristic line L2, the memory cell MC has a negative threshold voltage Va1 when electrical charges are not stored in the charge storing layer CS.

When the gate voltage of the memory cell MC of the normally-on type is 0V, the memory cell MC is in an ON state. In this case, the memory cell MC outputs a drain current of a current value I1.

As indicated by the characteristic line L1, the value of the threshold voltage of the memory cell MC increases when electrical charges are stored in the charge storing layer CS (an accumulated state). The memory cell MC is changed to a transistor of a normally-off type by controlling the charge amount in the charge storing layer CS.

For example, when the gate voltage of the memory cell MC of the normally-off type is 0V, the memory cell MC is in an OFF state. In this case, the drain current of the memory cell MC is substantially 0. A memory cell MC with a charge storing layer CS in the accumulated state is turned on by applying to the memory cell MC a higher gate voltage than the threshold voltage Va2 (Va2 is higher than 0V). This causes the memory cell MC with the charge storing layer CS in the accumulated state to output a drain current.

As a result, the magnitude of the drain current (or the ON/OFF state of the memory cell) is associated with the data, thereby enabling determination of whether the memory cell MC has "1" data or "0" data.

In the case described below, "0" data is allocated to a memory cell MC in which a charge storing layer CS is set to the depletion state, and "1" data is allocated to a memory cell MC in which a charge storing layer CS is set to the accumulated state. The allocation of data may be discretionarily set; "1" data may be allocated to a memory cell MC where a charge storing layer CS is in the depletion state, and "0" data may be allocated to a memory cell MC where a charge storing layer CS is in the accumulated state.

For example, if a gate voltage of 0V is applied to a control gate electrode (word line WL) of a memory cell MC as a read voltage VRD, it can be determined whether the data in the memory cell MC is "1" data or "0" data based on the magnitude of a drain current.

The threshold voltage of the memory cell MC varies according to whether or not the charge storing layer CS of the memory cell MC has electrical charges (electrons). As a result, if a read voltage VRD of a given magnitude is applied to a gate of the memory cell MC, the drain current varies in accordance with the charge amount in the charge storing layer CS. By using such characteristics, the memory cell MC in the semiconductor memory device 1 of the present embodiment can store data of 1 bit or more.

1.3 Write Operation

Figure 8:
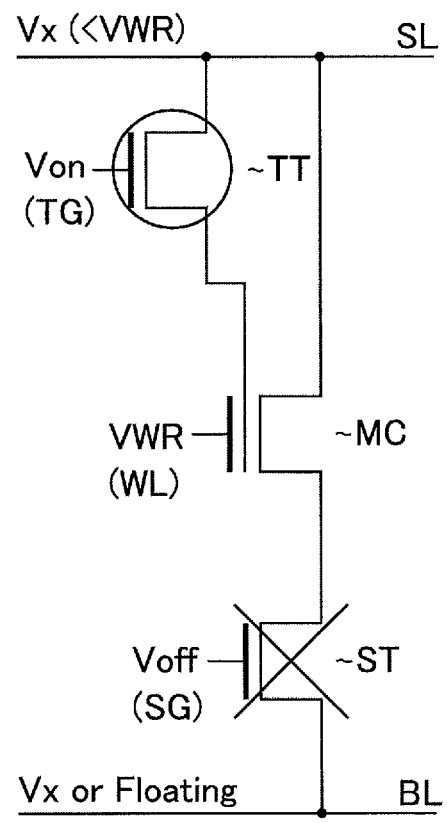
FIG. 8 is an equivalent circuit diagram of the memory unit showing a write operation in the semiconductor memory device according to the first embodiment.
Figure 8:
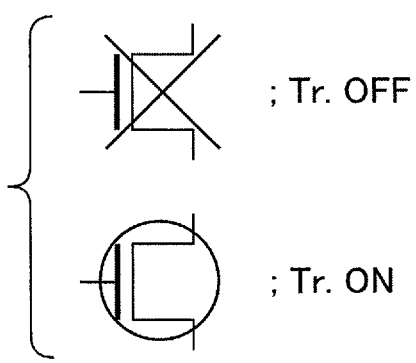

Next, a write operation will be described with reference to FIGS. 7 and 8. FIG. 7 is a schematic diagram for explaining a write operation to the memory unit MU (memory cell MC). FIG. 8 shows an equivalent circuit of the memory unit MU. In the example shown in FIG. 7, the semiconductor substrate 100 and the insulating layers 40, 41, and 42 are not shown.

As shown in FIG. 7, for example, when writing "1" data in the memory unit MU, a voltage higher than that of the source line SL is applied to the control gate electrode of the memory cell MC (word line WL). As a result, electrical charges are stored in the charge storing layer CS of the memory cell MC from the source line SL.

Specifically, electrical charges (e$^-$) are supplied from the source line SL to the charge storing layer CS, through the contact plugs V1 and CH and the channel formed in the oxide semiconductor layer 44 in the transfer transistor TT that is in the ON state.

The electrical charges are supplied to (or discharged from) the charge storing layer CS of the memory cell MC from a direction parallel to the layer surface of the charge storing layer CS (the film surface of the oxide semiconductor film 44). The layer surface of the charge storing layer CS is substantially parallel to the Z-axis direction.

As shown in FIG. 8, a voltage Vx is applied to the source line SL. The voltage Vx is, for example, 0V or a positive voltage lower than a write voltage VWR.

An ON voltage Von is applied to a gate electrode of the transfer transistor TT (the transfer gate line TG). The voltage Von turns on a corresponding transistor; in other words, generates a channel, and varies in accordance with the characteristics of the transistor. As a result, the transfer transistor TT is turned on, and a channel is formed in the oxide semiconductor layer 44 of the transfer transistor TT. The charge storing layer CS of the memory cell MC is electrically coupled to the source line SL via the channel in the oxide semiconductor layer 44 of the transfer transistor TT (and the contact plugs CH and V1).

When storing (accumulating) electrical charges in the charge storing layer CS, in other words, when writing "1" data in the memory unit MU, for example, a write voltage VWR is applied to the control gate electrode of the memory cell MC (word line WL). The voltage VWR is a positive voltage higher than the voltage Vx applied to the source line SL. As a result, the electrical charges (e$^-$) are stored in the charge storing layer CS of the memory cell MC from the source line SL via the transfer transistor TT.

An OFF voltage Voff is applied to the gate electrode of the select transistor ST (select gate line SG). The OFF voltage Voff turns off a corresponding transistor (namely, does not generate a channel) and varies in accordance with the characteristics of the transistor. For example, if the transistor is a transistor of a normally-on type, the voltage Voff is set to a negative voltage. As a result, the select transistor ST is turned off.

The bit line BL is not electrically coupled to the memory cell MC. Thus, the same voltage Vx as the source line SL may be applied to the bit line BL, the bit line BL may be set to a floating state, or a discretionary voltage may be applied to the bit line BL.

After the electrical charges are stored in the charge storing layer CS, an OFF voltage Voff is applied to the transfer gate line TG while the voltage VWR is applied to the word line WL. As a result, the transfer transistor TT is turned off. The charge storing layer CS in which the electrical charges are stored is electrically separated from the source line SL so as to avoid leakage of the electrical charges from the charge storing layer CS to the source line SL.

After the charge storing layer CS is electrically isolated from the source line SL, the word line WL is set to an electrically floating state. To the source line SL and the bit line BL, for example, a voltage Voff is applied. As a result, the memory cell MC maintains the state where electrons are stored (accumulated) in the charge storing layer CS. The memory cell MC becomes a transistor of a normally-off type by storing electrical charges in the charge storing layer CS.

Next, a case where the charge storing layer CS of the memory cell MC is set to a depletion state will be described. In other words, a case where "0" data is written into the memory unit MU or an erase operation will be described.

In the memory unit MU, for example, a voltage Voff (e.g., a voltage VSS or 0 V) is applied to the word line WL when a channel is generated in the oxide semiconductor layer 44 of the transfer transistor TT. This leads to discharge of electrons from the charge storing layer CS without said electrons being induced in the charge storing layer CS of the memory cell MC. As a result, the charge storing layer CS of the memory cell MC is set to a depletion state.

The write operation of data to the memory cell MC is performed in the above manner. As described above, the memory cell MC can hold data of 1 bit by obtaining the accumulated state where electrical charges are stored in the charge storing layer CS, or the depletion state where electrical charges are not stored in the charge storing layer CS.

Figure 9:
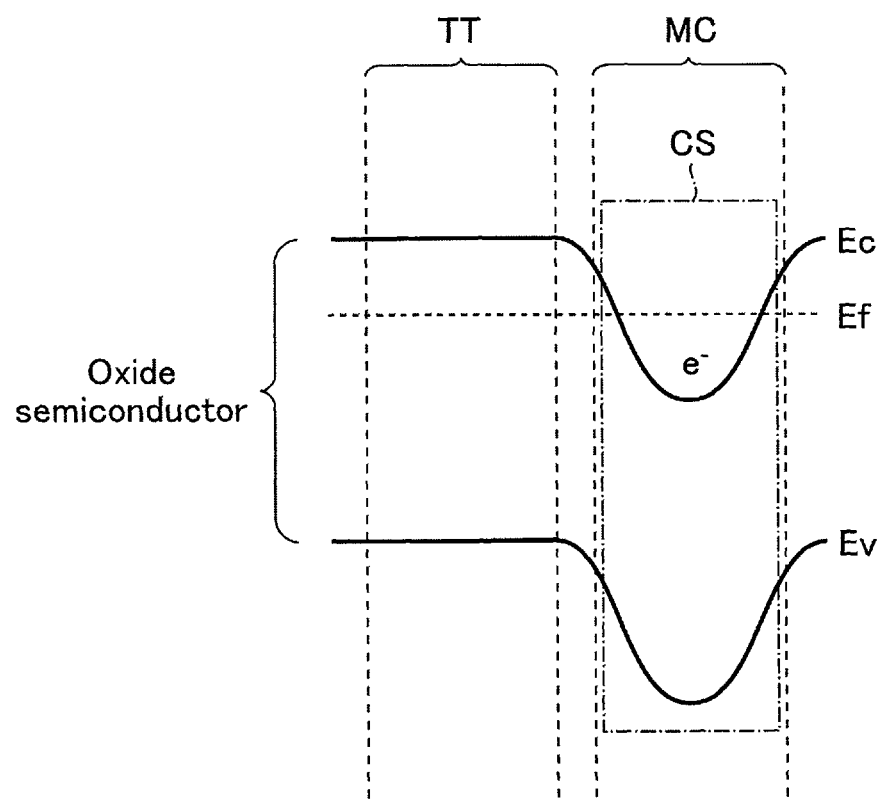
FIG. 9 is a band gap diagram of an oxide semiconductor in the memory unit in the semiconductor memory device according to the first embodiment.

Next, a "1" data holding state (an accumulated state) of the memory cell MC will be described with reference to FIG. 9. FIG. 9 is a schematic diagram showing a band gap state in the "1" data holding state of the memory cell MC. FIG. 9 shows a state of band energy Ec at the bottom end of a conduction band, and energy Ev at the top end of a valence band of the oxide semiconductor layer 44, used for the charge storing layer CS, based on the positional relationship between the memory cell MC and the transfer transistor TT.

As shown in FIG. 9, the transfer transistor TT and the memory cell MC are provided on the continuous oxide semiconductor layer 44. If the electrical charges (e⁻) are accumulated in the charge storing layer CS, the energy Ec of the oxide semiconductor layer 44 in the memory cell MC becomes lower than the Fermi level Ef.

The band gap (the difference between the energy Ec and the energy Ev) of the oxide semiconductor layer 44 used for the charge storing layer CS is about three times larger than the band gap of silicon. For example, the band gap of InGaZnO is about 3.5 eV. Accordingly, even if the electrical charges (e⁻) are stored in the charge storing layer CS of the memory cell, leakage of electrons through the interband tunnel between the conduction band and the valence band in the oxide semiconductor layer 44 is negligibly small. Thus, as long as the transfer transistor TT is not turned on, the electrical charges in the charge storing layer CS of the memory cell MC are held in the oxide semiconductor layer 44, and are not discharged to the source line SL.

Therefore, in the semiconductor memory device 1 of the present embodiment, the memory cell MC can hold data substantially in a non-volatile manner even if the charge storing layer CS of the memory cell MC is not a floating gate electrode isolated from other members.

1.4 Read Operation

Next, a read operation will be described with reference to FIG. 10.

Figure 10:
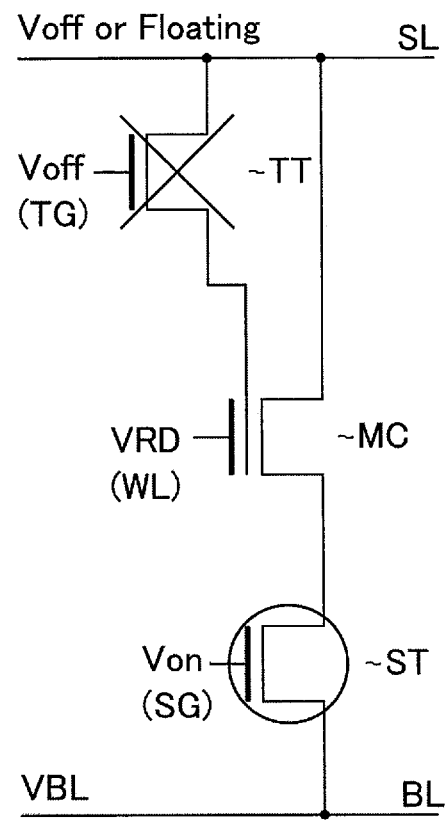
FIG. 10 is an equivalent circuit diagram of the memory unit showing a read operation in the semiconductor memory device according to the first embodiment.
Figure 10:
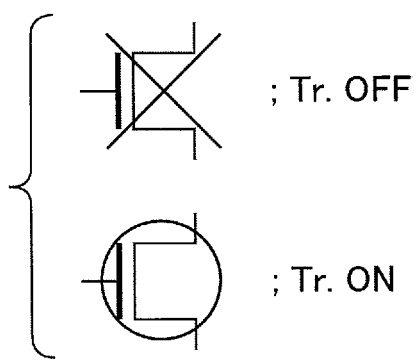

As shown in FIG. 10, a positive voltage VBL is applied to the bit line BL. The voltage VBL is higher than the OFF voltage Voff. For example, a voltage Voff is applied to the source line SL. The source line SL may be set to a floating state.

An OFF voltage Voff is applied to the gate electrode (transfer gate line TG) of the transfer transistor TT. As a result, the transfer transistor TT is turned off.

An ON voltage Von is applied to the gate electrode of the select transistor ST (select gate line SG). As a result, the select transistor ST is turned on, and a channel is formed in the semiconductor layer 46 of the select transistor ST.

In this state, a read voltage VRD is applied to the control gate electrode of the memory cell MC (word line WL). In accordance with an operation of the memory cell MC to which the read voltage VRD is applied, a current (read current) flows in the semiconductor layer 46 between the source line SL and the bit line BL.

The magnitude of the read current varies in accordance with the amount of electrical charges in the charge storing layer CS of the memory cell MC. Specifically, the memory cell MC is in an OFF state if the memory cell MC is in the accumulated state; in other words, if the threshold voltage of the memory cell MC is Va2 (>VRD). In contrast, the memory cell MC is in an ON state if the memory cell MC is in the depletion state; in other words, if the threshold voltage of the memory cell MC is Va1 (<VRD). Accordingly, the read current corresponding to the memory cell MC in the accumulated state is smaller than the read current corresponding to the memory cell MC in the depletion state. The read voltage VRD is discretionarily set so as to secure a margin of a current value of the read current in accordance with the amount of electrical charges in the charge storing layer CS.

The sense amplifier of the write/read circuit 14 senses the read current (or a potential of the source line SL) and compares said read current with a reference value. Alternatively, the sense amplifier senses the presence or absence of the read current. As a result, it is determined whether the data in a selected cell MC is "1" data or "0" data.

1.5 Voltages of Interconnects in Write Operation and Read Operation

Figure 11:
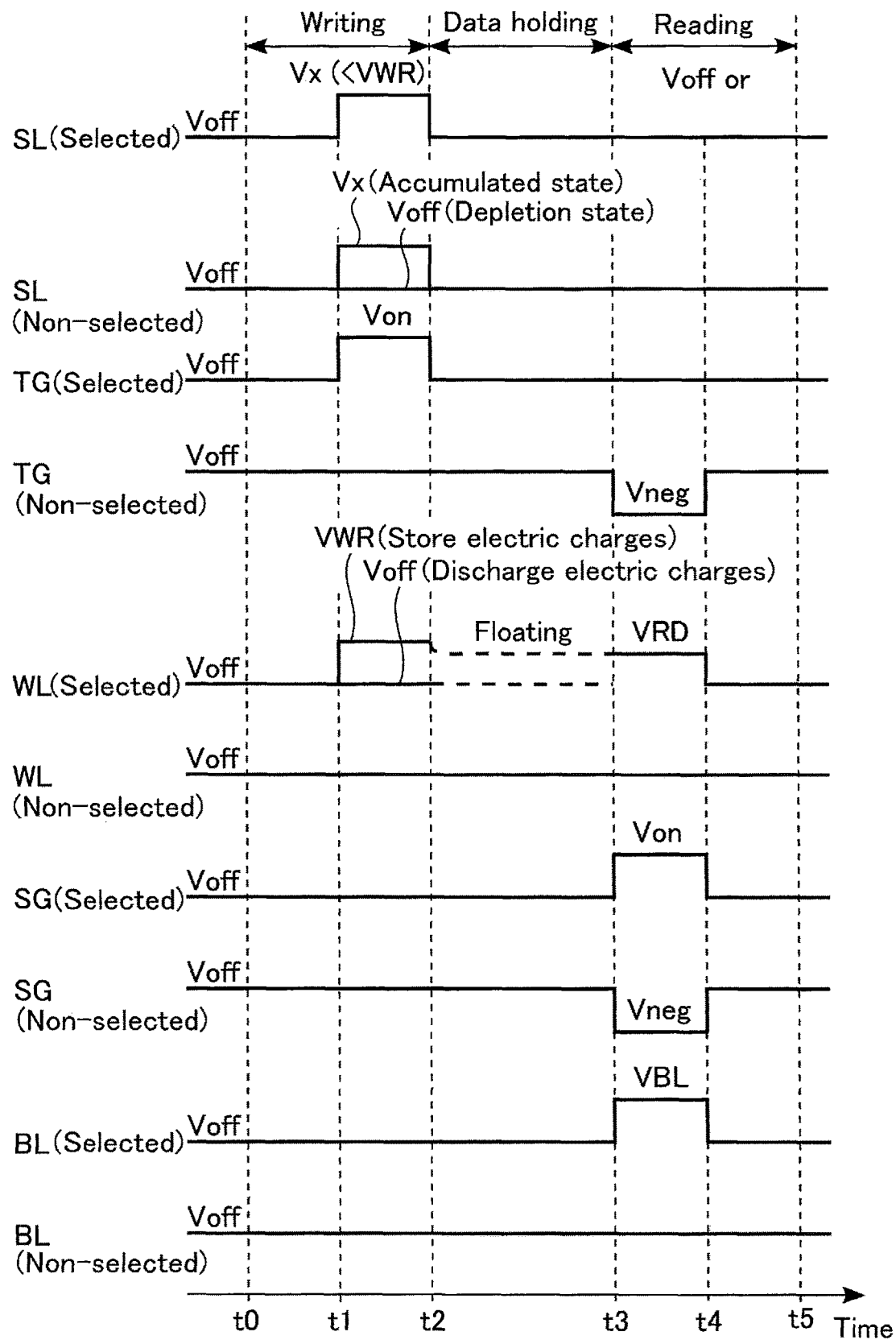
FIG. 11 is a timing chart showing voltages of interconnects during a write operation, a data holding state, and a read operation in the semiconductor memory device according to the first embodiment.

Next, an example of voltages of the interconnects in the write operation and the read operation will be described with reference to FIG. 11. The example in FIG. 11 shows voltages of the interconnects in the write operation, the data holding operation, and the read operation. In the following description, a memory unit MU and a memory cell MC, selected as targets of an operation, will be referred to as a "selected unit MU" and a "selected cell MC", respectively. On the other hand, a memory unit MU and a memory cell MC that are not selected will be referred to as a "non-selected unit MU" and a "non-selected cell MC", respectively. A source line SL, a transfer gate line TG, a word line WL, a select gate line SG, and a bit line BL corresponding to the selected unit MU will be referred to as a "source line SL (selected)", a "transfer gate line TG (selected)", a "word line WL (selected)", a "select gate line SG (selected)", and a "bit line BL (selected)", respectively. A source line SL, a transfer gate line TG, a word line WL, a select gate line SG, and a bit line BL corresponding to the non-selected unit MU will be referred to as a "source line SL (non-selected)", a "transfer gate line TG (non-selected)", a "word line WL (non-selected)", a "select gate line SG (non-selected)", and a "bit line BL (non-selected)", respectively.

First, the write operation will be described.

As shown in FIG. 11, at time t0, an OFF voltage Voff is applied to the source line SL (selected/non-selected), the transfer gate line TG (selected/non-selected), the word line WL (selected/non-selected), the select gate line SG (selected/non-selected), and the bit line BL (selected/non-selected).

Next, at time t1, the write/read circuit 14 applies a voltage Vx to the source line SL (selected) corresponding to the selected unit MU via the SL selector 19. If the non-selected unit MU coupled to the transfer gate line TG (selected) is in the accumulated state ("1" data holding state), the write/read circuit 14 applies a voltage Vx to the corresponding source line SL (non-selected). If the non-selected unit MU is in the depletion state ("0" data holding state), the write/read circuit 14 applies a voltage Voff to the source line SL (non-selected). Through this operation, erroneous writing into the non-selected unit MU is suppressed.

In this state, the row controller 12 applies a voltage Von to the transfer gate line TG (selected) corresponding to the selected unit MU. Through this operation, the transfer transistor TT coupled to the transfer gate line TG (selected) is turned on.

In the case of storing electrical charges in the charge storing layer CS to set the charge storing layer CS to the accumulated state (for example, in the case of writing "1" data), the row controller 12 applies a voltage VWR to the word line WL (selected). In the case of discharging electrical charges of the charge storing layer CS to set the charge storing layer CS to the depletion state (for example, in the case of writing "0" data or the case of an erase operation), the row controller 12 applies a voltage Voff to the word line WL (selected).

Next, at time t2, a voltage Voff is applied to the source line SL (selected/non-selected), the word line WL (selected), and the transfer gate line TG (selected). As a result, the charge storing layer CS of the selected cell MC is electrically isolated from the source line SL, and maintained in the depletion state or the accumulated state.

For example, when the write operation to the selected cell MC ends, the sequencer 17 notifies the host device 2 of the end of the operation.

The data of the memory cell MC is held during the period between time t2 and time t3. Specifically, an OFF voltage Voff is applied to the source line SL (selected/non-selected), the transfer gate line TG (selected/non-selected), the word line WL (selected/non-selected), the select gate line SG (selected/non-selected), and the bit line BL (selected/non-selected). As a result, the charge storing layer CS in the selected cell MC is set to the floating state, and diffusion (leakage) or entry of electrical charges is reduced. Thus, the data holding state of the memory cell MC continues.

Next, the read operation will be described.

At time t3, the write/read circuit 14 applies a voltage Voff to the source line SL (selected/non-selected) and the bit line BL (non-selected), and applies a voltage VBL to the bit line BL (selected).

In this state, the row controller 12 applies a voltage Voff to the transfer gate line TG (selected) corresponding to the selected unit MU, applies a voltage VRD to the word line WL (selected), and applies a voltage Von to the select gate line SG (selected). As a result, the transfer transistor TT in the selected unit MU is turned off, and the select transistor ST is turned on. Then, a read current in accordance with the threshold voltage of the selected cell MC (the amount of electrical charges of the charge storing layer CS) flows from the bit line BL (selected) to the source line SL (selected).

Specifically, if the threshold voltage of the selected cell MC is lower than the voltage VRD (in other words, if the selected cell MC is in the depletion state), the selected cell MC is turned on, and a relatively large read current flows from the bit line BL (selected) to the source line SL (selected). In contrast, if the threshold voltage of the selected cell MC is higher than the voltage VRD (in other words, if the selected cell MC is in the accumulated state), the selected cell MC is turned off, and a relatively small read current flows from the bit line BL (selected) to the source line SL (selected).

The row controller 12 also applies a voltage Voff to the word line WL (non-selected) corresponding to the non-selected unit MU, and applies a negative voltage Vneg to the transfer gate line TG (non-selected) and the select gate line SG (non-selected). For example, the negative voltage Vneg is appropriately set so that the transfer transistor TT and the select transistor ST of the non-selected unit MU are turned off, even if the oxide semiconductor layer 44 is affected by a potential of the conductive layer 48 (V0) or even if the oxide semiconductor layer 44 becomes a parasitical channel in the transfer transistor TT through the setting of the threshold voltage, and the semiconductor layer 46 becomes a parasitical channel in the select transistor ST. The voltage applied to the transfer gate line TG (non-selected) and the select gate line SG (non-selected) is not limited to the negative voltage Vneg. As long as the transfer transistor TT and the select transistor ST are turned off, a voltage applied to the transfer gate line TG (non-selected) and the select gate line SG (non-selected) may be 0 V. As a result, the non-selected cell MC, the transfer transistor TT, and the select transistor ST of the non-selected unit MU are turned off.

The sense amplifier of the write/read circuit 14 senses a read current (or a potential of the source line SL (selected)). As a result, it is determined whether the data in a selected cell MC is "1" data or "0" data.

At time t4, a voltage Voff is applied to the transfer gate line TG (non-selected), the word line WL (selected), the select gate line SG (selected/non-selected), and the bit line BL (selected).

In the period between time t4 and time t5, for example, the sequencer 17 transfers the read data to the host device 2, thereby ending the read operation.

1.6 Method of Manufacturing Memory Cell Array

Next, a method of manufacturing the memory cell array will be described with reference to FIG. 12 to FIG. 20.

Figure 12:
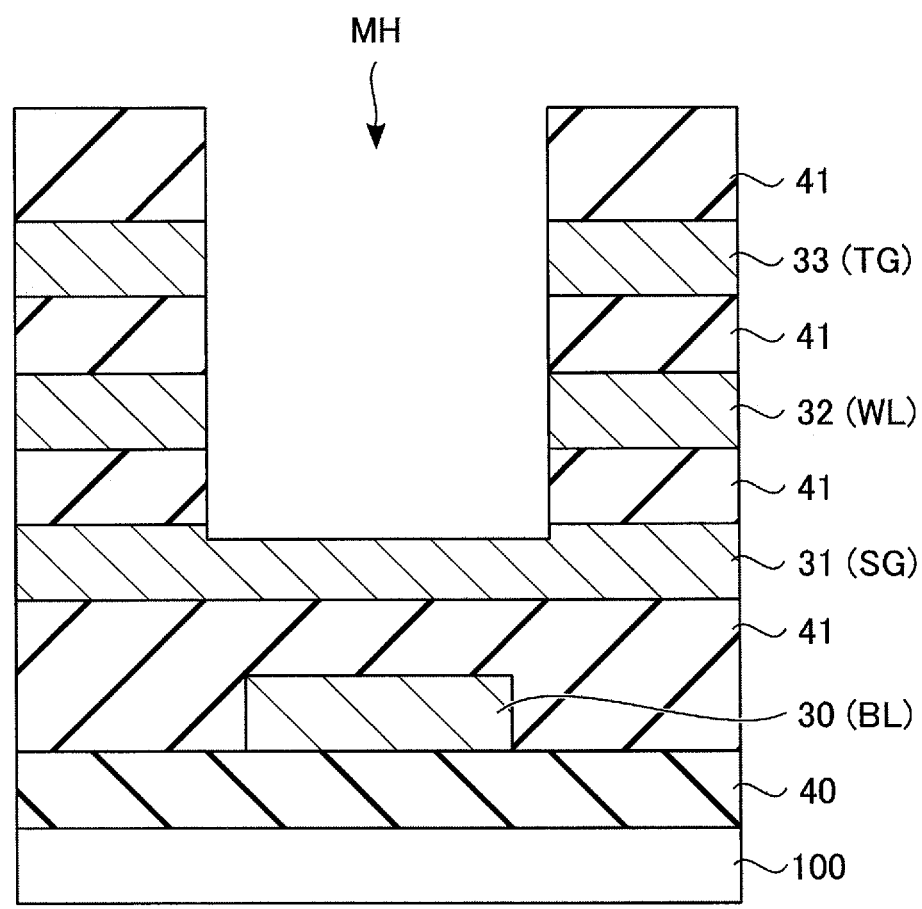

First, as shown in FIG. 12, an insulating layer 40 is formed on the semiconductor substrate 100. Next, an interconnect layer 30 is formed on the insulating layer 40. The interconnect layer 30 may be formed by etching a conductive material used for the interconnect layer 30, or as a trench interconnect (damascene interconnect). Then, an insulating layer 41 is formed to cover the interconnect layer 30. On the insulating layer 41, interconnect layers 31 to 33 are stacked in this order, with insulating layers 41 interposed between the interconnect layers. Furthermore, an insulating layer 41 is formed on the interconnect layer 33.

Next, a memory hole MH, having a bottom surface that reaches the interconnect layer 31, is formed.

Figure 13:
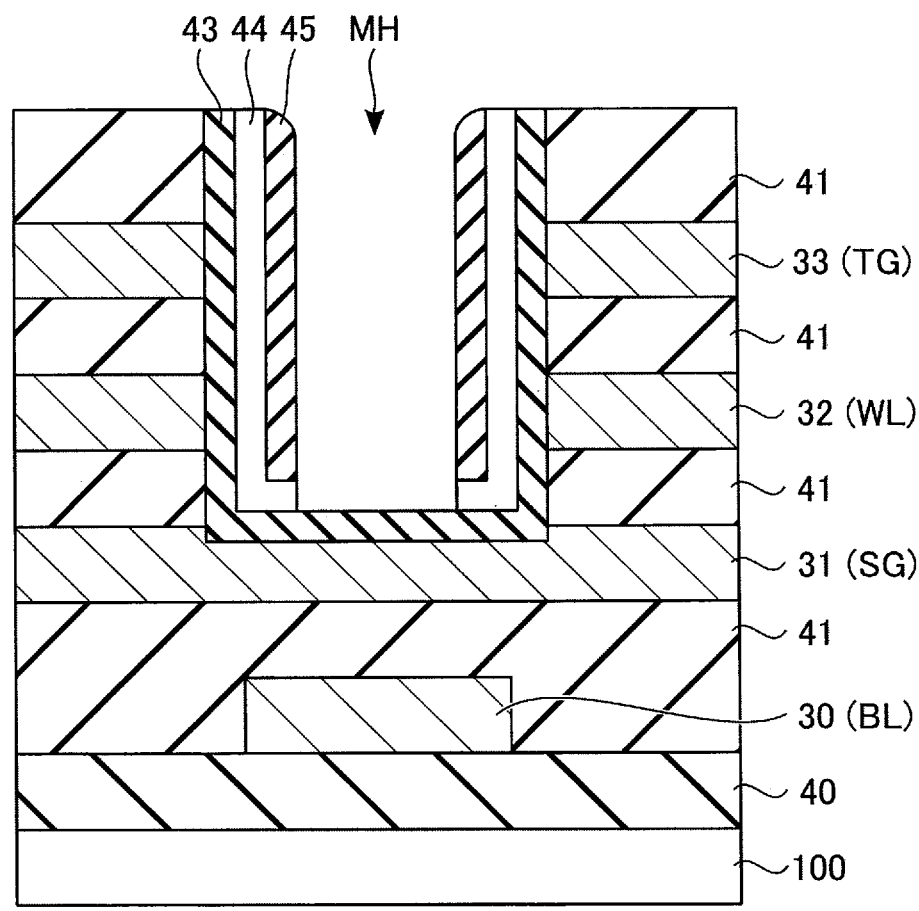

As shown in FIG. 13, an insulating layer 43, a semiconductor layer 44, and an insulating layer 45 are stacked in this order. Then, the semiconductor layer 44 and the insulating layer 45, on the surface of the uppermost insulating layer 41 and the bottom surface of the memory hole MH, are removed by etching (etching back). In the example of FIG. 13, the insulating layer 43 is removed from the surface of the uppermost insulating layer 41; however, said insulating layer 43 may be left on the surface of the uppermost insulating layer 41.

Figure 14:
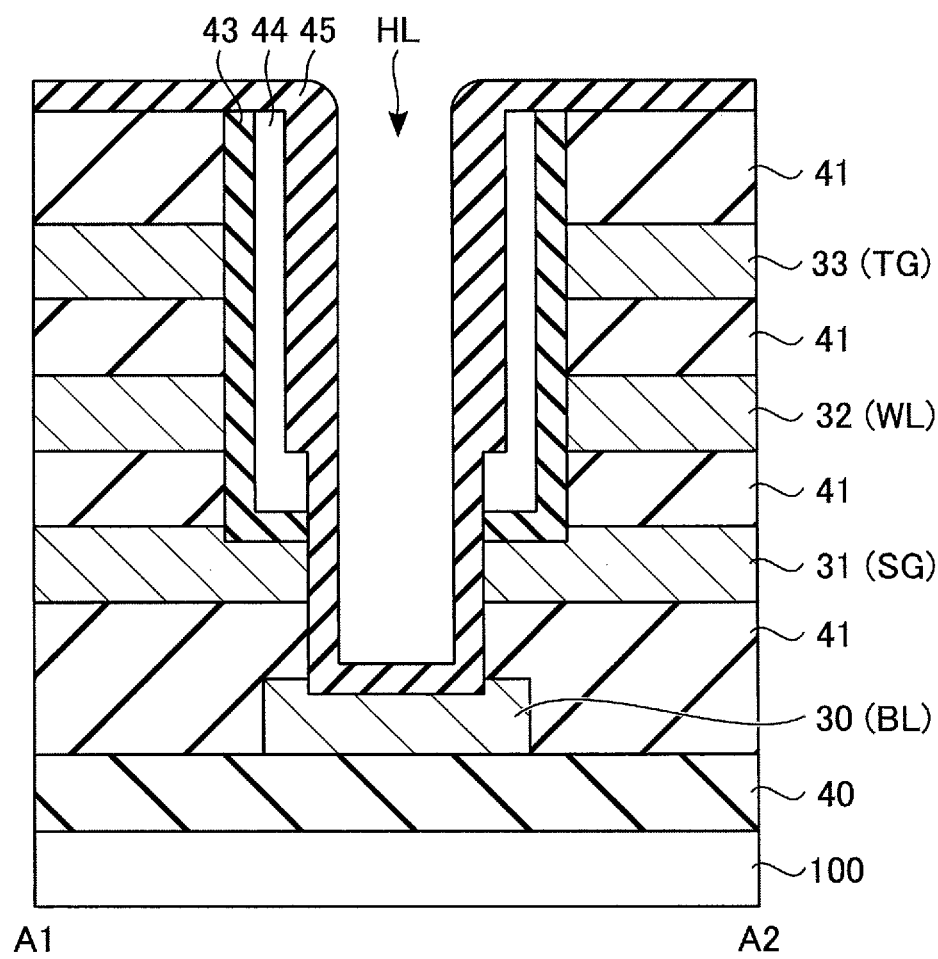

As shown in FIG. 14, a hole HL penetrating the memory hole MH and having a bottom surface that reaches the interconnect layer 30 is formed. Next, an insulating layer 45 is formed to cover the surface of the uppermost insulating layer 41 and the side surface and bottom surface of the hole HL.

Figure 15:
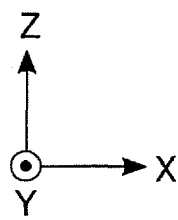
Figure 15:
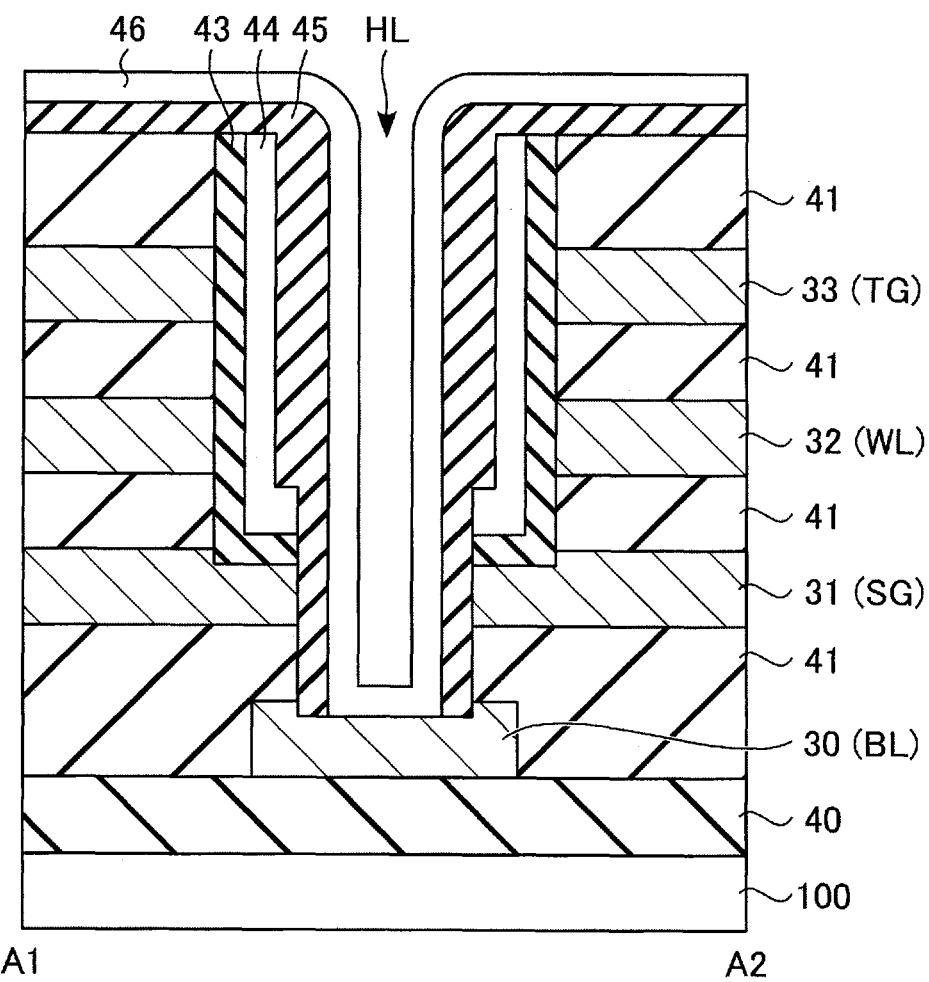

As shown in FIG. 15, the insulating layer 45 at the bottom of the hole HL is removed by etching back. Then, a semiconductor layer 46 is formed.

As shown in FIG. 16, the lower part of the hole HL is filled with an insulating layer 47. At this time, the top surface of the insulating layer 47 is located higher than the top surface of the interconnect layer 32 and lower than the bottom surface of the interconnect layer 33. Specifically, after filling the hole HL with an insulating layer 47, the level of the top surface of the insulating layer 47 in the hole HL is adjusted by etching back the insulating layer 47.

Figure 17:
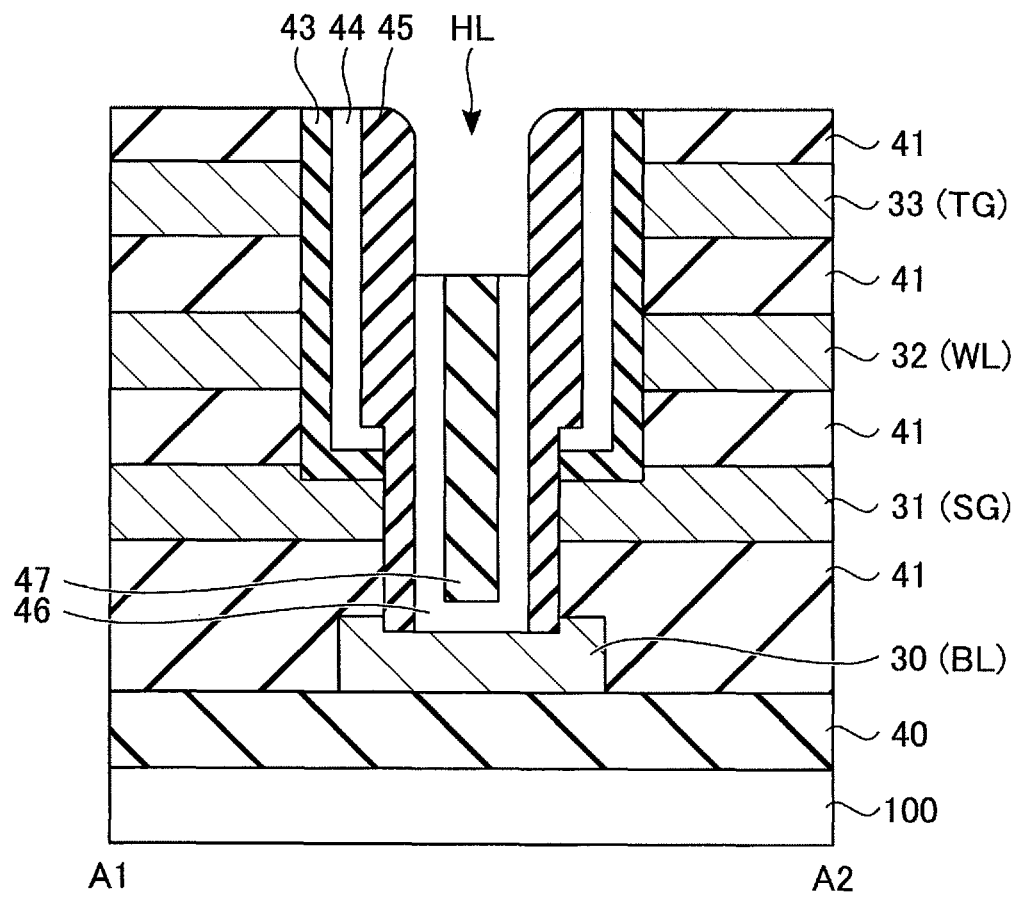

As shown in FIG. 17, the semiconductor layer 46 exposed on the surface above the insulating layer 45 and the side surface of the upper part of the hole HL is removed. At this time, the top surface of the remaining semiconductor layer 46 is located higher than the top surface of the interconnect layer 32 and lower than the bottom surface of the interconnect layer 33. When etching the exposed semiconductor layer 46, the insulating layer 45 is also etched until the top surface of the semiconductor layer 44 is exposed.

As shown in FIG. 18, the hole HL is filled with a conductive layer 48. The bottom surface of the conductive layer 48 is in contact with the semiconductor layer 46 and the insulating layer 47. Specifically, for example, if W is used as a conductive material, Ti and TiN are first formed as a barrier metal, and then tungsten is formed to fill the hole HL. After that, the excess Ti, TiN, and W on the insulating layer 41 are removed by CMP (chemical mechanical polishing).

As shown in FIG. 19, the insulating layer 41 is formed, and then a contact hole corresponding to a contact plug CH is formed. After that, the contact hole is filled with a conductive layer 49. A part of the bottom surface of the conductive layer 49 is in contact with the oxide semiconductor layer 44 and the conductive layer 48. The material of the conductive layer 49 may either be the same as, or different from, the material of the conductive layer 48.

As shown in FIG. 20, an insulating layer 42 is formed, then a contact hole corresponding to a contact plug V1 is formed. After that, the contact hole is filled with a conductive layer 35. The bottom portion of the conductive layer 35 is in contact with the conductive layer 49. The material of the conductive layer 35 may either be the same as, or different from, the material of the conductive layer 48 or 49.

Thereafter, as shown in FIG. 5, an interconnect layer 34 is formed on the conductive layer 35.

1.7 Advantageous Effect of Present Embodiment

The configuration according to the present embodiment can reduce power consumption. This effect will be described below.

For example, a DRAM using a capacitor performs a refresh operation for maintaining reliability of data after a read operation and while data is held. A DRAM experiences a problem of increase in power consumption due to the refresh operation.

In a system using the DRAM, operations due to a DRAM being a volatile memory, such as a save operation of data from the DRAM to a non-volatile memory and the data load when resuming an operation, are caused when the system is sleeping. This may increase the cost for the system.

On the other hand, the semiconductor memory device 1 according to the present embodiment stores data by accumulating electrical charges in the oxide semiconductor layer 44 that has a relatively large band gap. Thus, the semiconductor memory device 1 according to the present embodiment can reduce leakage of electrical charges from the memory cell MC, and improve data retention characteristics of the memory cell MC. Therefore, the semiconductor memory device 1 according to the present embodiment can reduce the number of times for performing a refresh operation. As a result, the semiconductor memory device 1 according to the present embodiment can reduce the power consumption.

The semiconductor memory device 1 according to the present embodiment can supply electrical charges to the charge storing layer CS of the memory cell MC from a direction parallel to the layer surface of the charge storing layer CS. This enables the write operation and the read operation of the memory cell MC to be performed without use of relatively high voltages, and thus degradation of the film of the memory cell MC can be suppressed.

The semiconductor memory device 1 according to the present embodiment can increase the cell density in the memory cell array 10.

Specifically, for example, if the transfer gate line TG (interconnect layer 33) extends in the Y-axis direction, and the word line WL (interconnect layer 32) and the select gate line SG (interconnect layer 31) extend in the X-axis direction, the width of the transfer gate line TG in the X-axis direction needs to be larger than the diameter of the pillar PLR, since the pillar PLR penetrates the transfer gate line TG. If a plurality of transfer gate lines TG are arranged, it is necessary to secure spaces between interconnects in the X-axis direction. Thus, the interval between pillars PLR in the X-axis direction depends on the interconnect pitch of the transfer gate lines TG.

On the other hand, the semiconductor memory device 1 according to the present embodiment includes: the word line WL (interconnect layer 32), the transfer gate line TG (interconnect layer 33), and the select gate line SG (interconnect layer 31) that extend in the X-axis direction; the bit line BL (interconnect layer 30) and the source line SL (interconnect layer 34) that extend in the Y-axis direction; and a pillar PLR that penetrates the word line WL, the transfer gate line TG, and the select gate line SG. In the semiconductor memory device 1 according to the present embodiment, the word line WL, the transfer gate line TG, and the select gate line SG can extend in the same direction. Thus, the interval between pillars PLR in the X-axis direction can be set based on the diameter of a pillar PLR and the pitch of the bit lines BL and the source lines SL. Accordingly, in the semiconductor memory device 1 according to the present embodiment, the interval between pillars PLR in the X-axis direction can be set narrower (denser) than in a case where the word line WL, the transfer gate line TG, and the select gate line SG do not extend in the same direction. This increases the cell density in the memory cell array 10. Thus, the semiconductor memory device 1 according to the present embodiment can decrease the area per control unit used for storing data.

The semiconductor memory device 1 according to the present embodiment can make the data held in the memory cell MC multi-valued. Therefore, the semiconductor memory device 1 according to the present embodiment can reduce the bit cost.

In the semiconductor memory device 1 according to the present embodiment, the oxide semiconductor layer 44 is not provided at the intersection of the select gate line SG and the pillar PLR. The semiconductor layer 46 is not provided at the intersection of the transfer gate line TG and the pillar PLR. Thus, the oxide semiconductor layer 44 does not function as a floating gate of the select transistor ST and the transfer transistor TT. Accordingly, the threshold voltages of the select transistor ST and the transfer transistor TT scarcely fluctuate. Therefore, for example, in the read operation, it is possible to suppress the fluctuation of a read current caused by fluctuation of the threshold voltages of the select transistor ST and the transfer transistor TT. This suppresses erroneous reading, and improves reliability of the semiconductor memory device 1.

2. Second Embodiment

Next, the second embodiment will be described. In the second embodiment, a layout of pillars PLR which differs from that in the first embodiment will be described. In the following, mainly the differences from the first embodiment will be described.

2.1 Planar Configuration of Memory Cell Array

Figure 21:
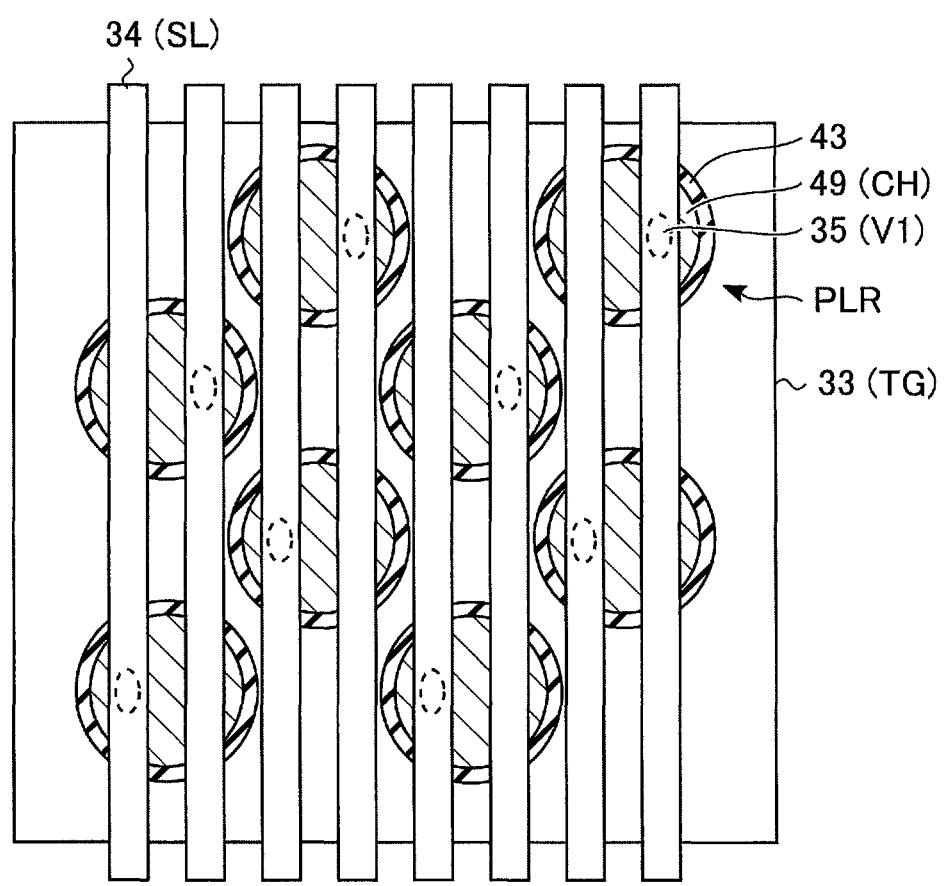
FIG. 21 is a top view of a transfer gate line in a memory cell array in a semiconductor memory device according to a second embodiment.

A planar configuration of a memory cell array will be described with reference to FIG. 21. FIG. 21 shows a top view of an interconnect layer 33 (transfer gate line TG) and interconnect layers 34 (source lines SL) on the XY plane. In FIG. 21, insulating layers 41 and 42 are not shown.

As shown in FIG. 21, the interconnect layer 33 extending in the X-axis direction is provided below the plurality of interconnect layers 34 extending in the Y-axis direction. In the interconnect layer 33, a plurality of pillars PLR penetrating the interconnect layer 33 are provided.

The example of FIG. 21 shows a case where two interconnect layers 34 are arranged above one pillar PLR. In this case, the plurality of pillars PLR are arranged in two staggered lines in the X-axis direction. Two pillars PLR arranged along the Y-axis direction are respectively coupled to the two different interconnect layers 34 arranged above the pillars PLR, via conductive layers 35 (contact plugs V1). Interconnect layers 30 (bit lines BL) (not shown) are arranged below interconnect layers 31 to 33 at the same pitch as the interconnect layers 34. Accordingly, two interconnect layers 30 are arranged under a pillar PLR.

The example of FIG. 21 shows a case where two source lines SL are arranged above a pillar PLR; however, the arrangement is not limited thereto. For example, three or more source lines SL may be arranged above a pillar PLR. In this case, pillars PLR of a number corresponding to the number of the source lines SL are arranged along the Y-axis direction in the interconnect layer 33 (and the interconnect layers 31 and 32).

2.2 Advantageous Effect of Present Embodiment

The configuration of the present embodiment achieves advantageous effects similar to those achieved by the first embodiment.

3. Third Embodiment

Next, a third embodiment will be described. In the case described in the third embodiment, memory units MU are arranged three-dimensionally. In the following, mainly the differences from the first and second embodiments will be described.

3.1 Cross-Sectional Configuration of Memory Cell Array

An example of a cross-sectional configuration of a memory cell array will be described with reference to FIG. 22.

Figure 22:
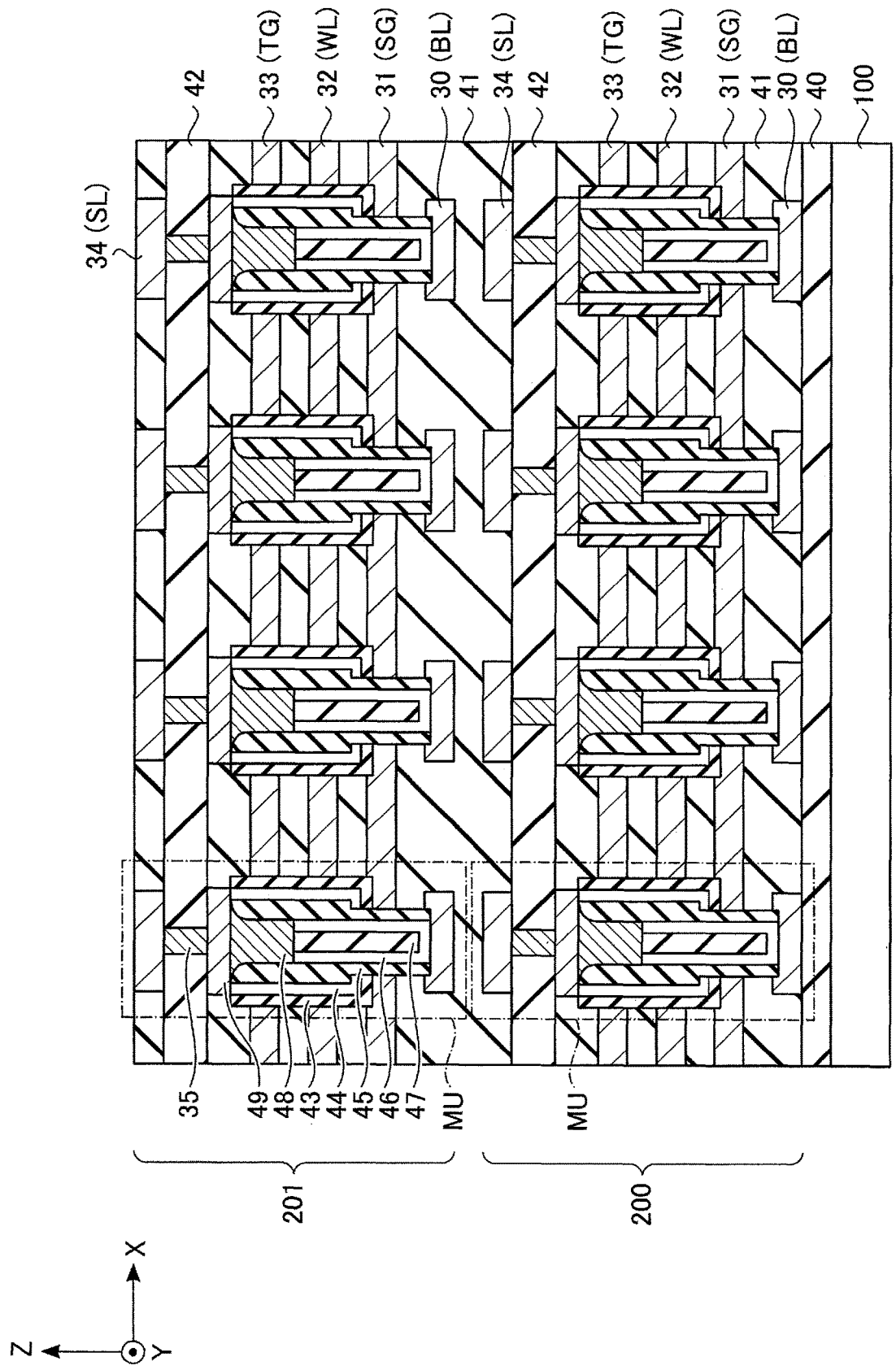
FIG. 22 is a top view of a memory cell array in a semiconductor memory device according to a third embodiment.

As shown in FIG. 22, a first array layer 200 and a second array layer 201 are arranged above a semiconductor substrate 100.

In the first array layer 200, a plurality of memory units MU are two-dimensionally arranged on the XY plane. Similarly to the first array layer 200, a plurality of memory units MU are two-dimensionally arranged on the XY plane in the second array layer 201. The configuration of each memory unit MU is the same as the first embodiment.

The number of array layers (memory units MU) stacked above the semiconductor substrate 100 is set discretionarily, and two or more array layers may be stacked. The arrangement of the memory units MU in the array layers may be set discretionarily and separately for each array layer.

3.2 Circuit Configuration of Memory Cell Array

Next, a circuit configuration of a memory cell array 10 will be described with reference to FIG. 23. In order to simplify the description, the example of FIG. 23 shows two memory units MU1 and MU2 provided in the first array layer 200, and two memory units MU3 and MU4 provided in the second array layer 201.

As shown in FIG. 23, the memory units MU1 and MU2 provided in the first array layer 200 are coupled in common to a transfer gate line TG1, a word line WL1, and a select gate line SG1. The memory unit MU1 is coupled to a bit line BL1 and a source line SL1, and the memory unit MU2 is coupled to a bit line BL2 and a source line SL2.

The memory units MU3 and MU4 provided in the second array layer 201 are coupled in common to a transfer gate line TG2, a word line WL2, and a select gate line SG2. The memory unit MU3 is coupled to the bit line BL1 and the source line SL1, and the memory unit MU4 is coupled to the bit line BL2 and the source line SL2.

The configurations of the memory units MU1 to MU4 are the same as those shown in FIG. 2 of the first embodiment.

The bit lines BL1 and BL2 are coupled to the BL selector 18 via transistors 60_1 and 60_2, respectively. The transistors 60_1 and 60_2 may be provided in the BL selector 18.

Signal lines SBL1 and SBL2 are coupled to the gates of the transistors 60_1 and 60_2, respectively. For example, to the signal lines SBL1 and SBL2, the decoder 11 transmits control signals based on the decoding result of a column address. For example, the transistor is turned on if a control signal is at a "High" level, and the transistor is turned off if a control signal is at a "Low" level.

The source lines SL1 and SL2 are coupled to the SL selector 19 via transistors 61_1 and 61_2, respectively. The transistors 61_1 and 61_2 may be provided in the SL selector 19.

Signal lines SSL1 and SSL2 are coupled to the gates of the transistors 61_1 and 61_2, respectively. For example, to the signal lines SSL1 and SSL2, the decoder 11 transmits control signals based on the decoding result of the column address.

The transfer gate lines TG1 and TG2 are coupled to the row controller 12 via transistors 62_1 and 62_2, respectively. The transistors 62_1 and 62_2 may be provided in the row controller 12.

Signal lines STG1 and STG2 are coupled to the gates of the transistors 62_1 and 62_2, respectively. For example, to the signal lines STG1 and STG2, the decoder 11 transmits control signals based on the decoding result of a row address.

The word lines WL1 and WL2 are coupled to the row controller 12 via transistors 63_1 and 63_2, respectively. The transistors 63_1 and 63_2 may be provided in the row controller 12.

Signal lines SWL1 and SWL2 are coupled to the gates of the transistors 63_1 and 63_2, respectively. For example, to the signal lines SWL1 and SWL2, the decoder 11 transmits control signals based on the decoding result of the row address.

The select gate lines SG1 and SG2 are coupled to the row controller 12 via transistors 64_1 and 64_2, respectively. The transistors 64_1 and 64_2 may be provided in the row controller 12.

Signal lines SSG1 and SSG2 are coupled to the gates of the transistors 64_1 and 64_2, respectively. For example, to the signal lines SSG1 and SSG2, the decoder 11 transmits control signals based on the decoding result of the row address.

For example, if the memory units MU1 and MU2 provided in the first array layer 200 are selected, control signals at a "High" level are transmitted to the signal lines STG1, SWL1, and SSG1 to turn on the transistors 62_1, 63_1, and 64_1. On the other hand, control signals at a "Low" level are transmitted to the signal lines STG2, SWL2, and SSG2 to turn off the transistors 62_2, 63_2, and 64_2.

Furthermore, if the memory unit MU1 is selected, control signals at a "High" level are transmitted to the signal lines SBL1 and SSL1 to turn on the transistors 60_1 and 61_1. On the other hand, control signals at a "Low" level are transmitted to the signal lines SBL2 and SSL2 to turn off the transistors 60_2 and 61_2.

3.3 Advantageous, Effect of Present Embodiment

The configuration of the present embodiment achieves advantageous effects similar to those achieved by the first embodiment.

Furthermore, in the configuration of the present embodiment, the memory units MU can be arranged three-dimensionally. This leads to increase in the storage density of the memory cell array 10 and suppression of increase in the chip area.

4. Fourth Embodiment

Next, a fourth embodiment will be described. In the fourth embodiment, a configuration of a memory unit MU which differs from that in the first embodiment will be described. In the following, mainly the differences from the first embodiment will be described.

4.1 Circuit Configuration of Memory Cell Array

First, a circuit configuration of a memory cell array will be described with reference to FIG. 24. In order to simplify the description, the example of FIG. 24 shows memory units MU of the m×n memory units MU in the memory cell array 10 in an arrangement of 2×2 (m=n=2).

Figure 24:
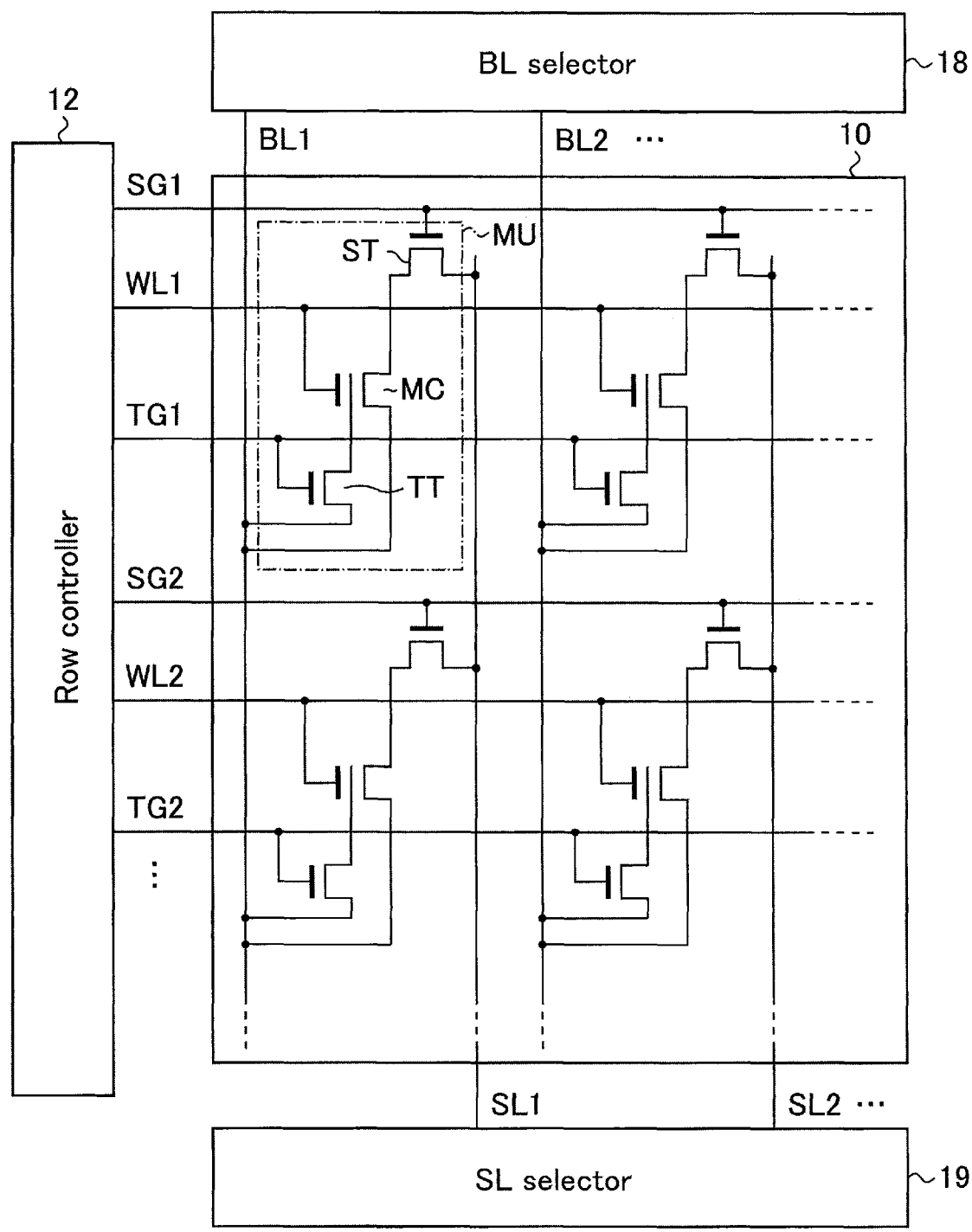
FIG. 24 is a circuit diagram of a memory cell array in a semiconductor memory device according to a fourth embodiment.

As shown in FIG. 24, similarly to FIG. 2 of the first embodiment, a plurality of (herein, four) memory units MU are arranged along the row direction and the column direction in the memory cell array 10.

One end of a memory cell MC is coupled to a bit line BL, and the other end of the memory cell MC is coupled to one end of a select transistor ST. A gate of the memory cell MC is coupled to a word line WL, and a charge storing layer CS is coupled to one end of a transfer transistor TT.

The other end of the transfer transistor TT is coupled to the bit line BL, and a gate of the transfer transistor TT is coupled to a transfer gate line TG.

The other end of the select transistor ST is coupled to a source line SL, and a gate of the select transistor ST is coupled to a select gate line SG.

4.2 Cross-Sectional Configuration of Memory Unit MU

Next, a cross-sectional configuration of the memory unit MU will be described with reference to FIG. 25.

Figure 25:
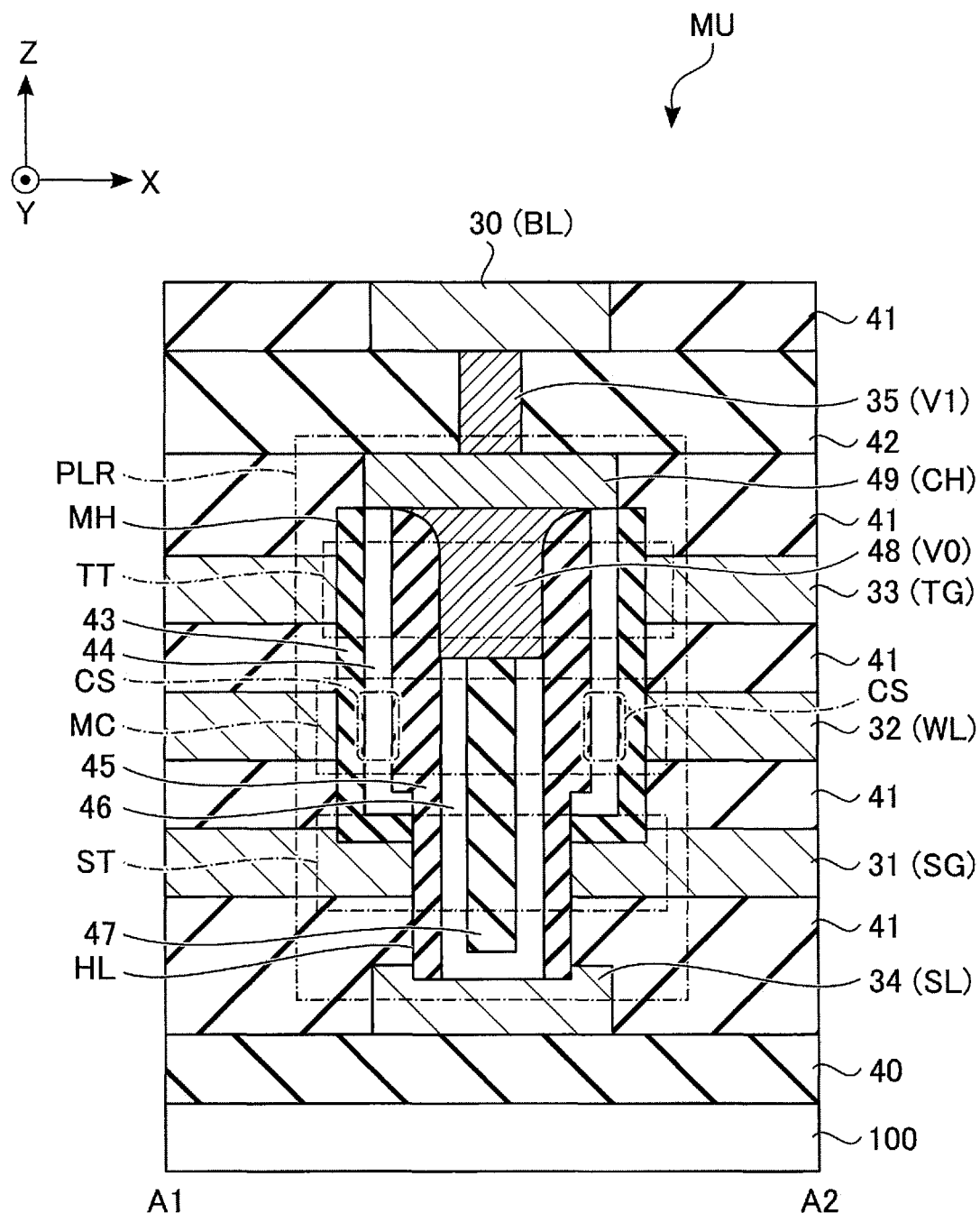
FIG. 25 is a cross-sectional view of a memory unit in the semiconductor memory device according to the fourth embodiment.

As shown in FIG. 25, the memory unit MU of the present embodiment has a configuration in which the bit line BL (interconnect layer 34) and the source line SL (interconnect layer 30) in FIG. 5 of the first embodiment are replaced with each other. Accordingly, the conductive layer 48 functions as the contact plug V0 for electrically coupling the oxide semiconductor layer 44, the semiconductor layer 46, and the interconnect layer 30 (bit line BL). The other configurations are the same as those shown in FIG. 5.

4.3 Advantageous Effect of Present Embodiment

The configuration of the present embodiment achieves advantageous effects similar to those achieved by the first embodiment.

5. Fifth Embodiment

Next, a fifth embodiment will be described. The fifth embodiment will describe a case where a memory cell MC is a transistor of a normally-off type when a charge storing layer CS of the memory cell MC is in a depletion state. In the following, mainly the differences from the first to fourth embodiments will be described.

5.1 Characteristics of Memory Cell

The characteristics of a memory cell MC of the present embodiment will be described with reference to FIG. 26. FIG. 26 is a graph showing V-I characteristics of the memory cell MC.

In FIG. 26, the characteristic line (solid line) L3 indicates the V-I characteristics of the transistor when electrical charges are stored in the charge storing layer CS of the memory cell MC (an accumulated state). The characteristic line (dashed line) L4 indicates the V-I characteristics of the transistor in a state where electrical charges are not stored in the charge storing layer CS of the memory cell MC (a depletion state).

As shown in FIG. 26, the memory cell MC of a normally-off type is in an OFF state when a gate voltage of 0 V is applied. By applying a positive voltage higher than 0 V to the gate electrode, the memory cell MC of the normally-off type is turned on.

As indicated by the characteristic lines L3 and L4, even if the transistor of the normally-off type is used for the memory cell MC, the threshold voltages Vb1 and Vb2 and the magnitude of the drain current of the memory cell MC vary in accordance with presence or absence of electrons (the accumulated state or depletion state) in the charge storing layer CS.

In this case, similarly to a transistor of a normally-on type, it can be determined whether the data in the memory cell MC is "1" data or "0" data by setting the read voltage VRD to a positive voltage that satisfies Vb1<VRD<Vb2.

This enables the memory cell MC to retain data of 1 bit or more.

For example, the memory cell MC operates as a transistor of a normally-off type if an n-type semiconductor layer of low concentration (n⁻-type semiconductor layer) or a p-type semiconductor layer is used for the semiconductor layer 46.

5.2 Advantageous Effect of Present Embodiment

The configuration of the present embodiment is applicable to the first to fourth embodiments.

6. Modifications

According to above embodiment, a semiconductor memory device includes: a first interconnect (BL); a second interconnect (SL) provided above the first interconnect in a first direction (Z direction); a third interconnect (SG) provided between the first interconnect and the second interconnect in the first direction; a fourth interconnect (WL) provided between the second interconnect and the third interconnect in the first direction; a fifth interconnect (TG) provided between the second interconnect and the fourth interconnect in the first direction; a semiconductor layer (46) extending in the first direction, and having one end located between the fourth interconnect and the fifth interconnect and other end connected to the first interconnect in the first direction; a memory cell (MC) storing information between the semiconductor layer and the fourth interconnect; a conductive layer (48) extending in the first direction, and having one end connected to the second interconnect and other end connected to the semiconductor layer in the first direction; a first insulating layer (45) extending in the first direction, and provided to extend between the third interconnect and the semiconductor layer, between the fourth interconnect and the semiconductor layer, and between the fifth interconnect and the conductive layer; an oxide semiconductor layer (44) extending in the first direction, and provided to extend between the fourth interconnect and the first insulating layer and between the fifth interconnect and the first insulating layer; and a second insulating layer (43) extending in the first direction, and provided to extend between the fourth interconnect and the oxide semiconductor layer and between the fifth interconnect and the oxide semiconductor layer.

By applying the above embodiments, a semiconductor memory device that can reduce power consumption can be provided.

The embodiments are not limited to the above-described aspects, but can be modified in various ways.

For example, the memory cell MC may store data of 2 bits or more. In this case, a threshold voltage level corresponding to each data is set in the memory cell MC. For example, in a write operation, a write voltage VWR in accordance with each threshold voltage level is set. As a result, the memory cell MC can store data of 2 bits or more by controlling the amount of electrical charges stored in the charge storing layer CS (the threshold voltage level). For example, in a read operation, a read voltage VRD is set in accordance with each threshold voltage level. As a result, data in accordance with a threshold voltage level can be read.

The first to fifth embodiments can be combined as far as possible.

The term "couple" in the above-described embodiments includes the state of indirect coupling via other component such as a transistor or a resistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first interconnect;
a second interconnect provided above the first interconnect in a first direction;
a third interconnect provided between the first interconnect and the second interconnect in the first direction;
a fourth interconnect provided between the second interconnect and the third interconnect in the first direction;
a fifth interconnect provided between the second interconnect and the fourth interconnect in the first direction;
a semiconductor layer extending in the first direction, and having one end located between the fourth interconnect and the fifth interconnect and other end connected to the first interconnect in the first direction;
a memory cell storing information between the semiconductor layer and the fourth interconnect;
a conductive layer extending in the first direction, and having one end connected to the second interconnect and other end connected to the semiconductor layer in the first direction, the other end of the conductive layer being located between the fourth interconnect and the fifth interconnect;
a first insulating layer extending in the first direction, and provided to extend between the third interconnect and the semiconductor layer, between the fourth interconnect and the semiconductor layer, and between the fifth interconnect and the conductive layer;
an oxide semiconductor layer extending in the first direction, and provided to extend between the fourth interconnect and the first insulating layer and between the fifth interconnect and the first insulating layer; and
a second insulating layer extending in the first direction, and provided to extend between the fourth interconnect and the oxide semiconductor layer and between the fifth interconnect and the oxide semiconductor layer.

2. The device according to claim 1, wherein
the first and second interconnects extend in a second direction intersecting the first direction, and the third, fourth, and fifth interconnects extend in a third direction intersecting the first and second directions.

3. The device according to claim 1, wherein
the conductive layer includes:
a first portion connected to a top surface of the semiconductor layer, and extending in the first direction; and
a second portion connected to a top surface of the first portion and to the oxide semiconductor layer.

4. The device according to claim 3, wherein
the conductive layer further includes a third portion which is connected to a top surface of the second portion and extends in the first direction to be connected to the second interconnect.

5. The device according to claim 1, wherein
the first insulating layer is in contact with a lower surface of a portion of the conductive layer that is connected to the oxide semiconductor layer.

6. The device according to claim 1, wherein one end of the oxide semiconductor layer is located between the third interconnect and the fourth interconnect in the first direction.

7. The device according to claim 1, further comprising:
a first transistor includes the third interconnect and the semiconductor layer; and
a second transistor includes the fifth interconnect and the oxide semiconductor layer.

8. The device according to claim 1, wherein the first interconnect is a bit line, and the second interconnect is a source line.

9. A semiconductor memory device comprising:
a bit line;
a source line;
a pillar extending in a first direction that is directed from the bit line to the source line, and including a semiconductor layer;
first, second, and third conductive layers arranged along the first direction, and facing a side surface of the pillar;
a first transistor arranged at a first intersection of the first conductive layer and the pillar;
a memory cell arranged at a second intersection of the second conductive layer and the pillar, and including a charge storing layer constituted by an oxide semiconductor layer arranged between the semiconductor layer and the second conductive layer; and
a second transistor arranged at a third intersection of the third conductive layer and the pillar,
wherein a first end of the oxide semiconductor layer in the first direction is electrically coupling to the source line via the second transistor, and
a second end of the oxide semiconductor layer in the first direction is located between the first intersection and the second intersection, and is electrically disconnected from the bit line.

10. The device according to claim 9, wherein
a first end of the semiconductor layer in the first direction is located between the second intersection and the third intersection, and
a second end of the semiconductor layer in the first direction is in contact with the bit line.

11. The device according to claim 9, wherein
a channel region of the first transistor and a channel region of the memory cell are arranged in the semiconductor layer.

12. The device according to claim 9, wherein
a channel region of the second transistor is arranged in the oxide semiconductor layer.

13. The device according to claim 1, wherein a first end of the oxide semiconductor layer in the first direction is electrically coupling to the second interconnect, and a second end of the oxide semiconductor layer in the first direction is electrically disconnected from the first interconnect.

* * * * *